United States Patent
Heinrich et al.

(10) Patent No.: US 11,009,529 B2
(45) Date of Patent: May 18, 2021

(54) SEMICONDUCTOR CIRCUITS, DEVICES AND METHODS

(71) Applicants: X-FAB SEMICONDUCTOR FOUNDRIES AG, Erfurt (DE); MELEXIS TECHNOLOGIES SA, Bevaix (CH)

(72) Inventors: Klaus Heinrich, Erfurt (DE); Hartmut Liebing, Erfurt (DE); Andreas Roth, Erfurt-Urbich (DE); Stefan Eisenbrandt, Erfurt (DE); Andreas Ott, Erfurt (DE); Bruno Boury, Kontich (BE)

(73) Assignee: X-FAB SEMICONDUCTOR FOUNDRIES GMBH, Erfurt (DE)

( * ) Notice: Subject to any disclaimer, the term of this patent is extended or adjusted under 35 U.S.C. 154(b) by 190 days.

(21) Appl. No.: 15/715,268

(22) Filed: Sep. 26, 2017

(65) Prior Publication Data

US 2018/0088153 A1    Mar. 29, 2018

Related U.S. Application Data

(63) Continuation of application No. 15/673,759, filed on Aug. 10, 2017.

(30) Foreign Application Priority Data

Aug. 10, 2016  (EP) .................................... 16183640

(51) Int. Cl.
*H01L 29/78*      (2006.01)
*H01L 29/06*      (2006.01)
(Continued)

(52) U.S. Cl.
CPC ............. *G01R 17/02* (2013.01); *G01R 17/16* (2013.01); *G01R 19/0084* (2013.01);
(Continued)

(58) Field of Classification Search
None
See application file for complete search history.

(56) References Cited

U.S. PATENT DOCUMENTS

| 4,001,762 A | * | 1/1977 | Aoki | ...................... H01C 7/006 |
| | | | | 338/309 |
| 4,096,748 A | | 6/1978 | Pichon | |
| | | (Continued) | | |

FOREIGN PATENT DOCUMENTS

DE        102 13 876       10/2003
DE    10 2007 035 093       1/2009

OTHER PUBLICATIONS

Search Report dated Dec. 14, 2017 in corresponding European Application No. 17172540.1, 7 pages.

(Continued)

*Primary Examiner* — Michelle Mandala
*Assistant Examiner* — Jordan M Klein
(74) *Attorney, Agent, or Firm* — Nixon & Vanderhye PC

(57) ABSTRACT

A high-voltage sensing device providing full galvanic isolation between a high-voltage domain and a low-voltage domain, wherein the circuit topology of the device resembles that of a Wheatstone bridge, the Wheatstone bridge employing at least one voltage-controlled semiconductor resistor, wherein the circuit also comprises a reference source connected directly to the Wheatstone bridge and the device comprises a number of shielding structures to electrically isolate the high-voltage domain from the low-voltage domain.

15 Claims, 28 Drawing Sheets

(51) Int. Cl.
   *H01L 29/786* (2006.01)
   *H01L 29/8605* (2006.01)
   *G01R 17/02* (2006.01)
   *G01R 19/00* (2006.01)
   *G01R 17/16* (2006.01)
   *H01L 49/02* (2006.01)
   *H01L 29/40* (2006.01)

(52) U.S. Cl.
   CPC ...... *G01R 19/0092* (2013.01); *H01L 29/0649* (2013.01); *H01L 29/0692* (2013.01); *H01L 29/78* (2013.01); *H01L 29/786* (2013.01); *H01L 29/7838* (2013.01); *H01L 29/8605* (2013.01); *H01L 28/20* (2013.01); *H01L 29/402* (2013.01)

(56) References Cited

U.S. PATENT DOCUMENTS

| | | | |
|---|---|---|---|
| 5,200,733 A * | 4/1993 | Davis | H01L 23/585 257/E27.047 |
| 5,264,798 A | 11/1993 | Bey, Jr. | |
| 5,293,058 A | 3/1994 | Tsividis | |
| 5,461,322 A | 10/1995 | Bey, Jr. | |
| 5,583,442 A | 12/1996 | Isham et al. | |
| 5,753,815 A | 5/1998 | Murata | |
| 7,982,427 B2 | 7/2011 | Magana et al. | |
| 8,930,152 B2 | 1/2015 | Patel | |
| 9,568,523 B2 | 2/2017 | Herrmann | |
| 2003/0231077 A1 | 12/2003 | Nuspl | |
| 2005/0116301 A1 | 6/2005 | Shaw et al. | |
| 2008/0042241 A1 | 2/2008 | Chiang et al. | |
| 2008/0231294 A1 | 9/2008 | You et al. | |
| 2018/0045764 A1 | 2/2018 | Heinrich et al. | |

OTHER PUBLICATIONS

U.S. Appl. No. 15/673,759, filed Aug. 10, 2017, Heinrich et al.
Search Report for EP16183640.8, dated Feb. 8, 2017, 6 pages.
P. Mantenuto et al., "Uncalibrated Automatic Bridge-Based CMOS Integrated Interfaces for Wide-Range Resistive Sensors Portable Applications," Microelectronics Journal, vol. 45, No. 6, May 4, 2014, pp. 589-596.
Examination Report dated Apr. 17, 2020 in corresponding European Application No. 16183640.8, 5 pages.

* cited by examiner

SEMICONDUCTOR CIRCUITS, DEVICES AND METHODS

CROSS-REFERENCES TO RELATED APPLICATIONS

This application is a continuation of application Ser. No. 15/673,759 filed Aug. 10, 2017, which claims priority to EP Patent Application No. 16183640.8 filed 10 Aug. 2016, the entire contents of each of which are hereby incorporated by reference in this application.

TECHNICAL FILED

The present invention relates to semiconductor integrated circuits, and associated devices and methods, e.g. for sensing high voltages.

BACKGROUND

Presently, measuring a high DC voltage with a low-voltage domain integrated circuit is usually done with a resistive division. An example of such a circuit is shown in FIG. 1, where the circuit comprises a pair of resistors 101 and 102 to divide the high voltage $V_{HV}$. The circuit converts an input high voltage $V_{HV}$ into a low voltage V, thereby translating the input from a high-voltage domain 103 into a low-voltage domain 104. In the case where high AC voltages need to be measured, capacitive division can be used which provides some galvanic isolation. Galvanic isolation is a principle of isolating functional sections of electrical systems to prevent current flow. Such a circuit is shown in FIG. 2, and comprises a pair of capacitors 201 and 202 and a diode 203 for rectification. Again, the circuit converts an input high AC voltage $V_{HV}$ into a low voltage V.

Both of the above prior art circuits illustrated in FIGS. 1 and 2 draw some power drawn from the source to be measured, which introduces a measurement error depending on the quality of the source, thereby potentially deteriorating the result of the measurement. Furthermore, it may be desirable to draw minimal or no power from the source for other reasons, such as energy efficiency, or to improve the lifespan of the source.

One technique for achieving galvanic isolation when measuring high voltages with a low-voltage domain integrated circuit is to perform the measurement acquisition directly in the high-voltage domain and transmit the result by means of an opto-coupler to the low-voltage domain integrated circuit, as described in U.S. Pat. No. 7,982,427. However, the present inventors have appreciated certain problems associated with this technique in that it introduces additional complexity and overheads since active circuits are required in the high-voltage domain.

Certain embodiments of the present invention aim to provide an alternative technique which avoids these problems.

SUMMARY

Aspects of the invention are set out in the claims.

The present invention builds on the Wheatstone bridge measurement principle to derive an output voltage or current signal in a low voltage domain which is proportional to an input voltage signal in a high voltage domain with amplitudes up to e.g. 2500 V.

A semiconductor device in the form of a voltage-controlled semiconductor well resistor is disclosed which can withstand up to 2500 V at its gate and shows a monotonic change in resistance over the complete possible input gate voltage range.

Circuits are disclosed employing such sensing devices to enable the conversion of ultra-high voltages to a low-voltage domain.

Shielding structures are disclosed which overcome electric field coupling problems when having ultra-high voltage signals and low voltage signals present in the same measurement bridge.

Devices are disclosed employing such circuits to perform measurements of high voltage and power drawn at high voltage from a source.

One of the advantages of certain embodiments of the invention consists in particular in the fact that a standard CMOS process can be used to build the voltage-controlled semiconductor well resistor sensing elements. The circuit is capable of measuring DC and AC voltages without drawing static power from the source under measurement. Parasitic electrical field coupling between the ultra-high voltage circuit parts and the low voltage parts of a Wheatstone measurement bridge can be substantially reduced or completely eliminated using a new shielding structure. This enables the measurement of ultra-high voltage signals with standard low voltage CMOS circuit parts. Another advantage of certain embodiments of the invention is that the parasitic field inversion between adjacent circuit parts (the sensing element and the reference element) is substantially completely removed, which results in improved output signal accuracy. In contrast to the device disclosed in U.S. Pat. No. 7,982,427, the present invention does not require active circuits to translate a high voltage into the low voltage domain with galvanic isolation.

BRIEF DESCRIPTION OF THE DRAWINGS

Some embodiments of the invention will now be described by way of example only and with reference to the accompanying drawings, in which.

DESCRIPTION

Figure 1:
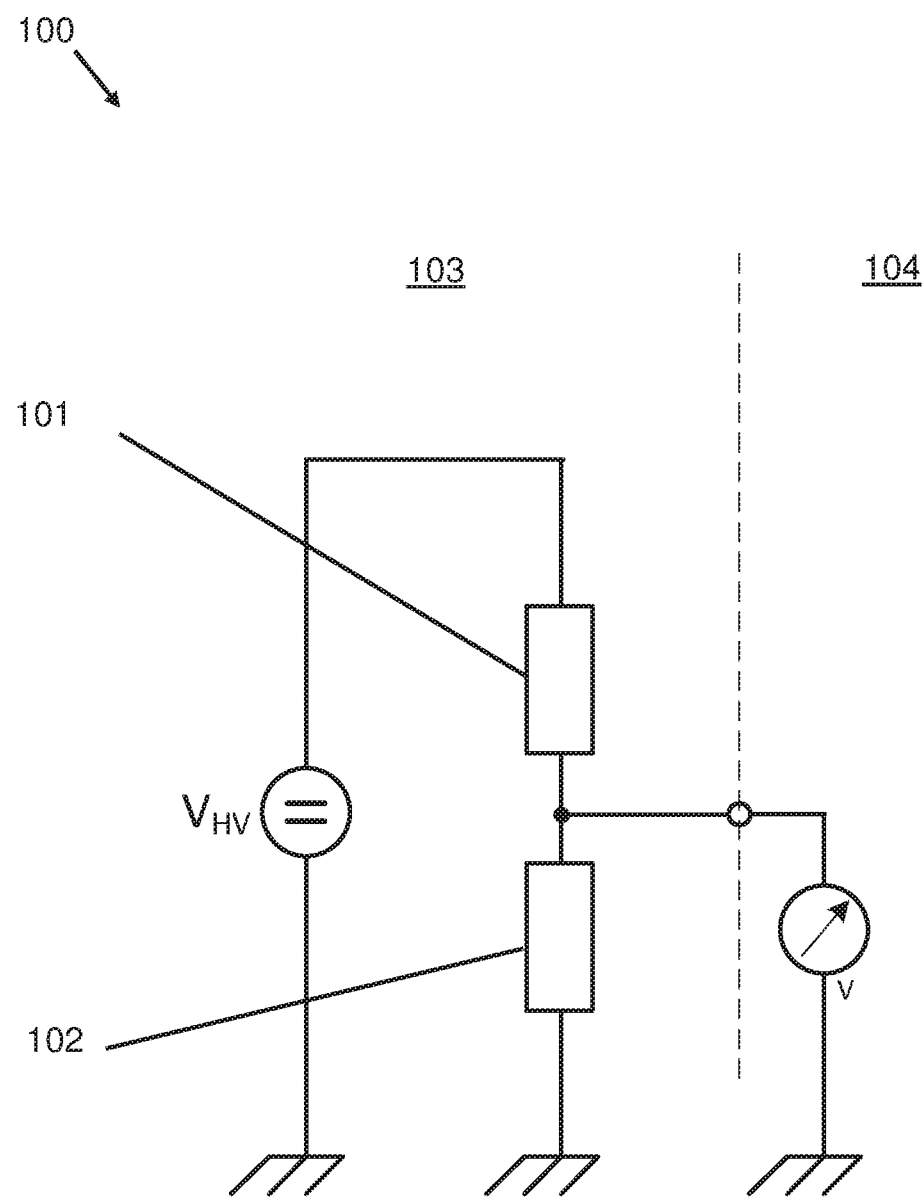
FIG. 1 shows a prior art voltage divider.
Figure 2:
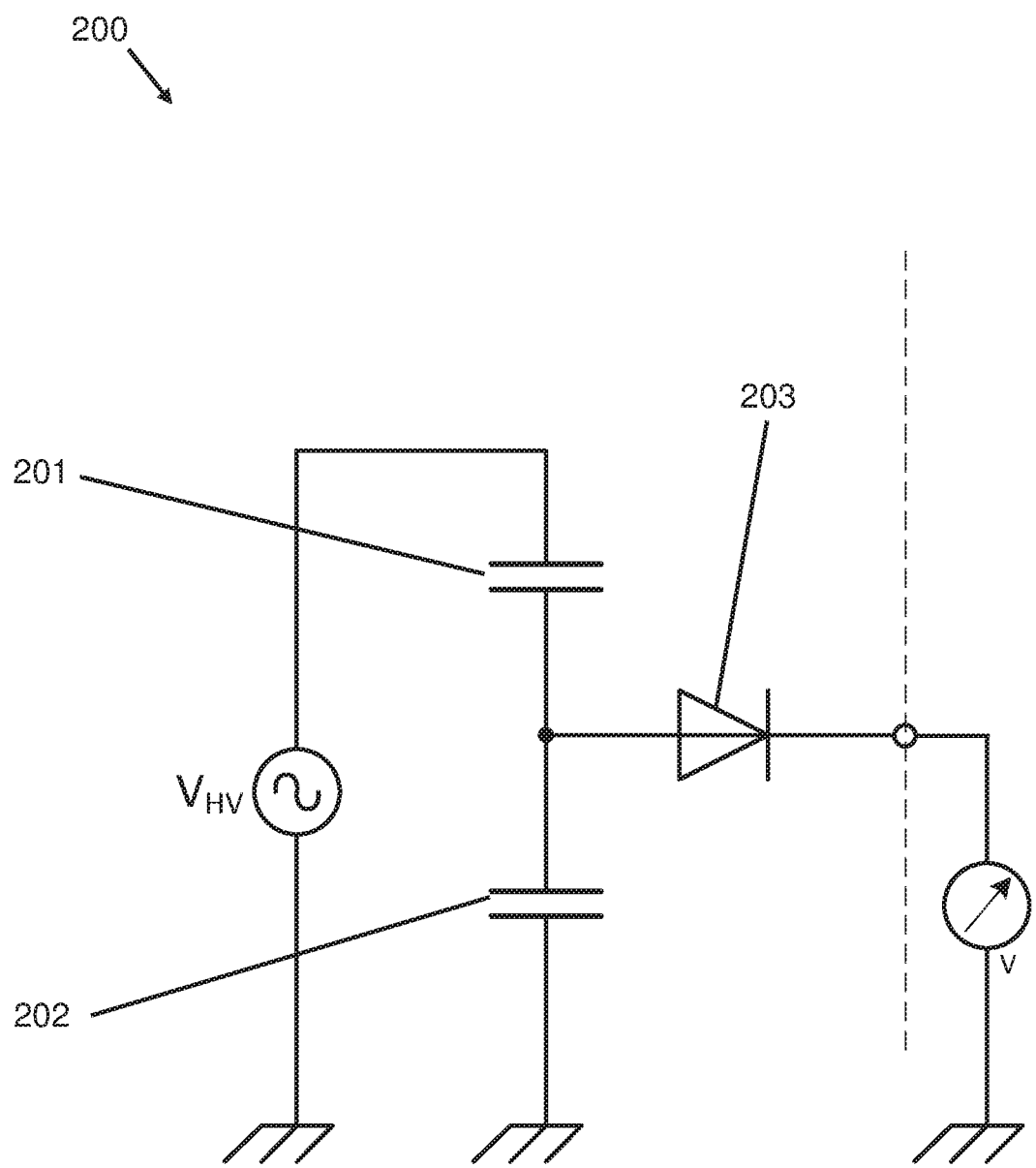
FIG. 2 shows a prior art voltage divider.
Figure 3A:
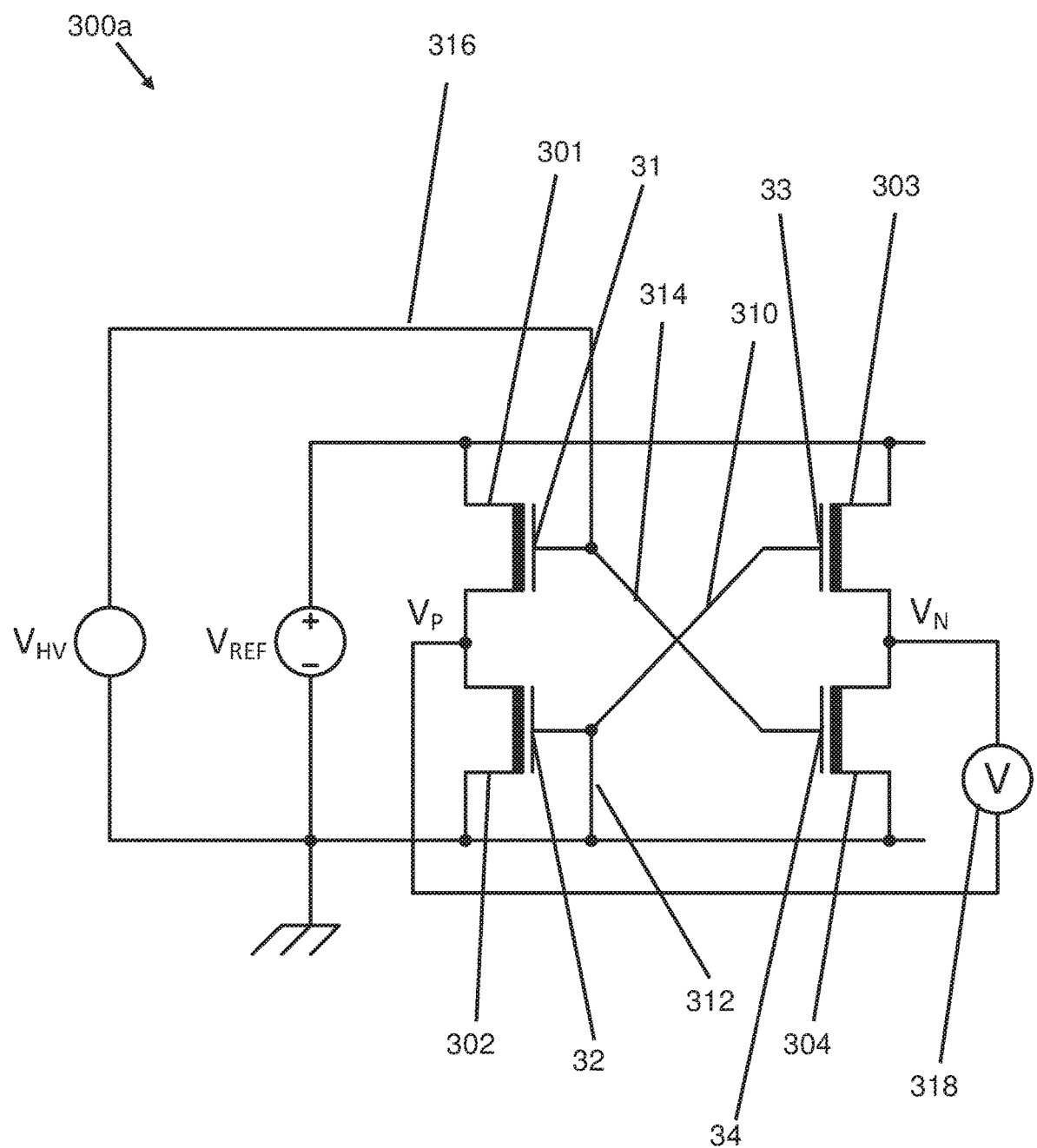
FIG. 3a shows a high-voltage measurement circuit according to an embodiment of the present invention.

FIG. 3a illustrates a sensing circuit 300a configured to measure an unknown high voltage $V_{HV}$. The circuit layout fundamentally resembles that of a Wheatstone bridge, where broadly speaking the conventional resistors of the Wheatstone bridge are replaced by four voltage-controlled semiconductor resistors (VCSRs) 301-304. A first series combination of two of the VCSRs (301 and 302, hereinafter the first and second VCSRs respectively) is connected in parallel with a second series combination of the other two VCSRs (303 and 304, hereinafter the third and fourth VCSRs respectively). Each of the VCSRs has a gate (31-34). The gates of the second and third VCSRs are connected by a second electrical interconnector 310 which has a connector 312 for connecting to a low electrical potential, e.g. ground. The gates of the first and fourth VCSRs are connected by a first electrical interconnector 314 which also has a connector 316 for connecting to the source developing a high voltage $V_{HV}$ with respect to said low electrical potential/ground. A reference voltage source, internal to the sensing circuit 300a, provides a voltage $V_{REF}$ with respect to said low electrical potential/ground. The reference voltage source is connected directly to the first and third VCSRs. Thus the voltage across the series combination of the first and second VCSRs is equal to that across the series combination of the third and fourth VCSRs, namely $V_{REF}$. In this sense the reference voltage source is connected across the two series combinations of VCSRs. The voltage at the point between the first and second VCSRs is denoted $V_P$. The voltage at the point between the third and fourth VCSRs is denoted $V_N$. $V_P$ and $V_N$ will be a function of the voltage $V_{HV}$ applied at the gates of the first and fourth VCSRs. To understand this, first consider the scenario where $V_{HV}=0$ (ground potential)—the same potential as the gate potential of the second and third VCSRs. In this scenario, the resistance of all four VCSRs (301-304) will be approximately the same (and ideally exactly the same), i.e. R1=R2=R3=R4=R. Thus, owing to the voltage-divider action of the two series combinations of VCSRs we have $V_P=V_N=V_{REF}/2$. Thus the output voltage V of the sensing circuit, which is the potential difference between the voltage at the point between the first and second VCSRs and the voltage at the point between the third and fourth VCSRs, $V=V_P-V_N=0$. Now consider the case where $V_{HV}$ is some positive voltage with respect to ground. Further, suppose that the resistance of the VCSRs decreases as the gate voltage is increased with respect to ground (the resistance decreases with increasing gate voltage in the case of an n-type well-resistor; resistance variations of similar magnitude will be expected in case of a p-type well resistor). Thus R1=R4=R−ΔR and R2=R3=R. This gives $V_P=R/(2R-\Delta R) \times V_{REF}$ and $V_N=(R-\Delta R)/(2R-\Delta R) \times V_{REF}$. The output voltage is thus $V=V_P-V_N=\Delta R/(2R-\Delta R) \times V_{REF}$. There are several key points of note. Firstly, as ΔR→∞, |V|→$V_{REF}$. Thus the maximum magnitude of the output V of the sensing circuit is $V_{REF}$, which is typically a low voltage, e.g. $V_{REF}$=5V. This protects downstream devices and connections against the input high voltage. Secondly, suppose the resistance of the VCSRs depends linearly on the applied gate voltage, then the output voltage V will also be linearly dependent on the input high voltage $V_{HV}$, i.e. $V=aV_{HV}+b$, where a is a scaling factor and b is a DC offset. If a and b are determined by characterizing the circuit then $V_{HV}$ can be determined by measuring V since $V_{HV}=(V-b)/a$. In the ideal case, b=0. Thirdly, there is no direct electrical connection between the output of the sensing circuit and the input high voltage source. Thus the circuit provides galvanic isolation between source and output. The output voltage V can be measured directly using a voltmeter 318.

Figure 3B:
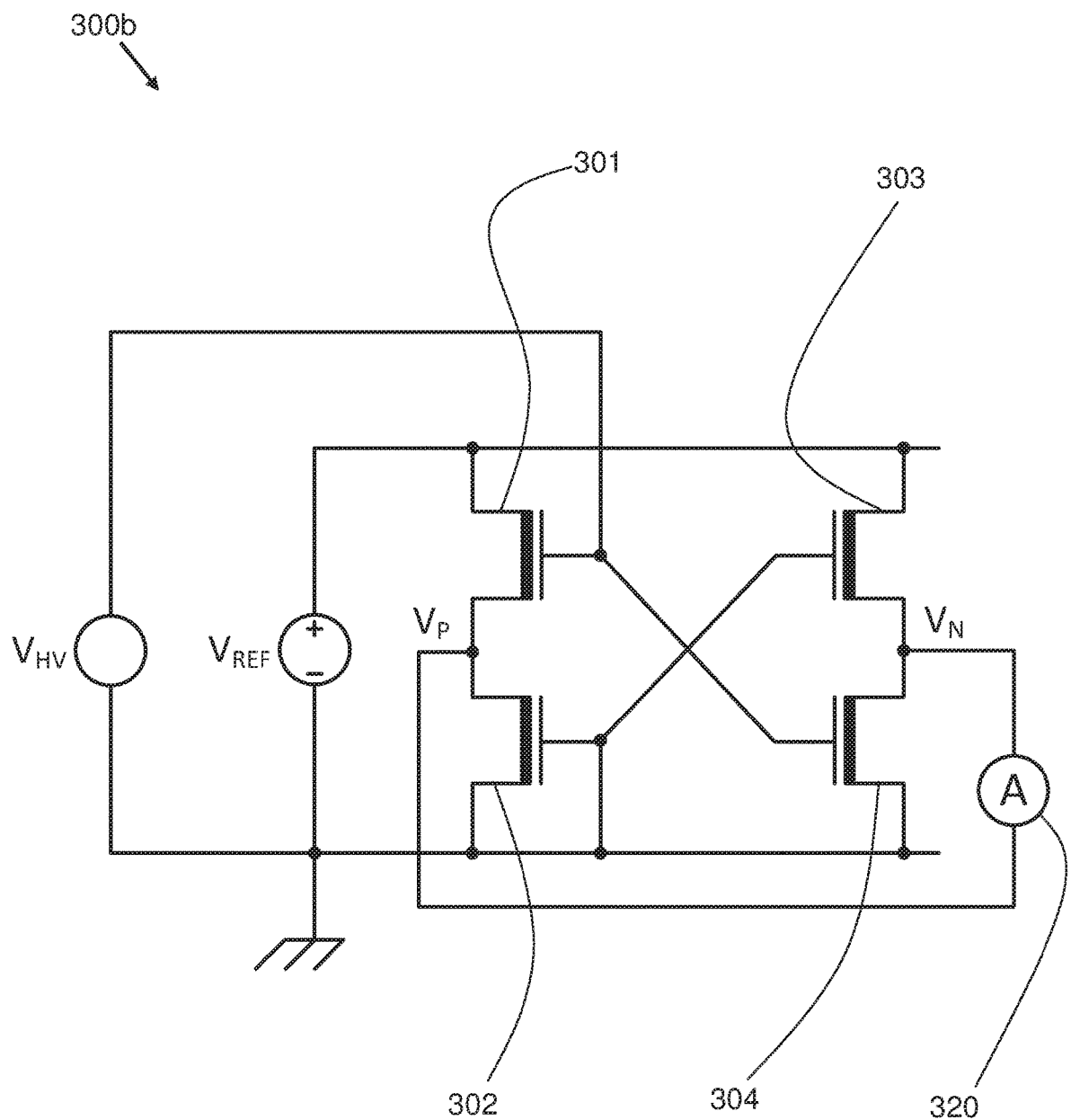
FIG. 3b shows a high-voltage measurement circuit according to an embodiment of the present invention.

FIG. 3b illustrates a variation on the sensing circuit of FIG. 3a. The circuit 300b is the same as that of FIG. 3a except that instead of measuring an output voltage $V=V_P-V_N$, the output is derived from the current flowing between the point between the first and second VCSRs and the point between the third and fourth VCSRs. The current A may be measured directly using an ammeter 320. Although an ammeter ideally has no series resistance, in reality shunt-based ammeters have a low-ohmic shunt introducing a small voltage drop caused by the current flow through the shunt. This voltage drop is then measured. Other methods may be used to sense the current, such as using a transimpedance amplifier which is actively forced to have zero voltage drop, i.e. a short-circuit. The current measured is then the transimpedance gain figure multiplied by the output voltage of the amplifier.

Figure 3C:
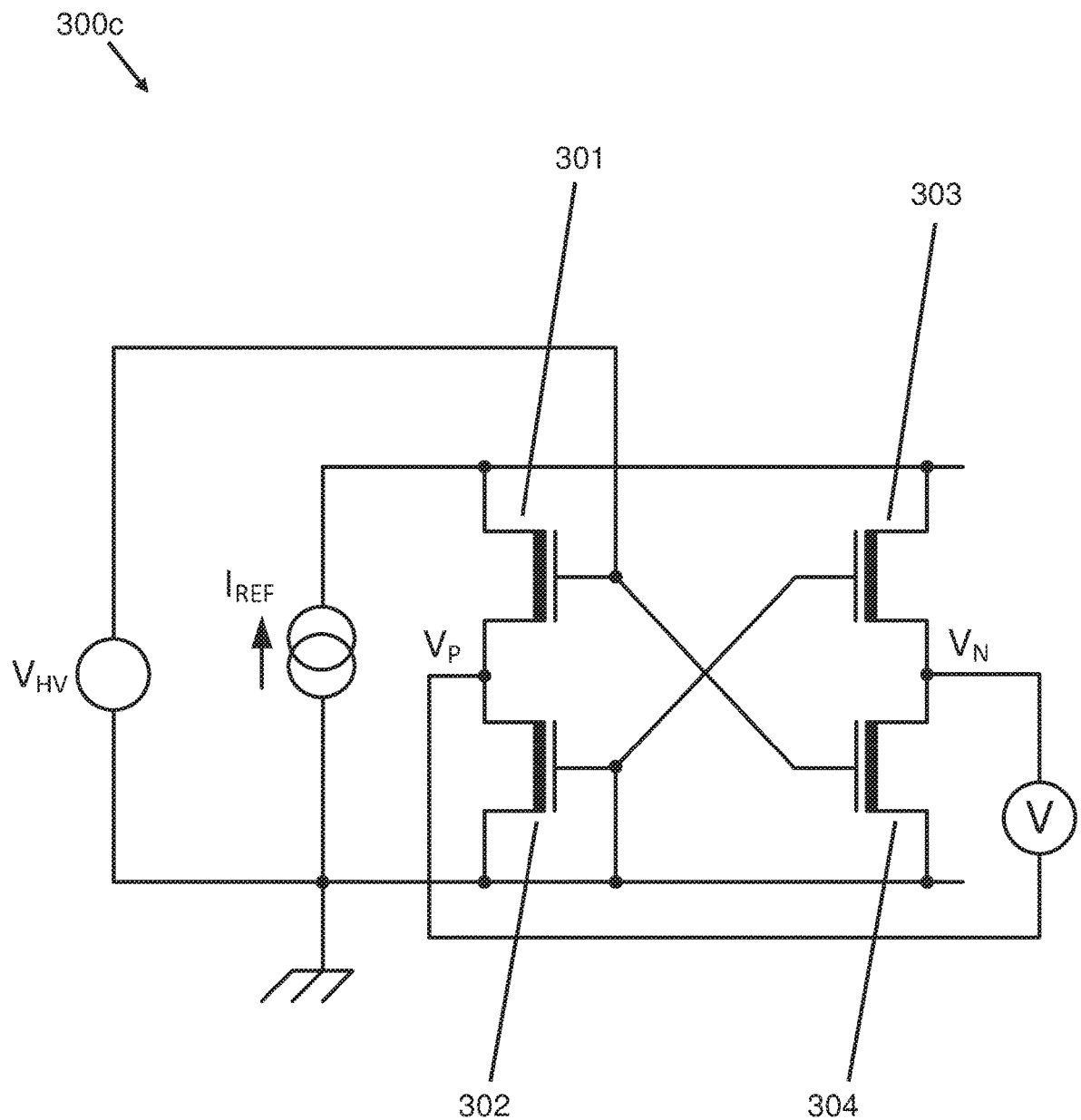
FIG. 3c shows a high-voltage measurement circuit according to an embodiment of the present invention.

FIG. 3c illustrates another variation on the sensing circuit of FIG. 3a. The circuit 300c is the same as that of FIG. 3a except that the reference voltage source has been replaced with a reference current source providing a reference current $I_{REF}$. The reference current source is connected directly to the first and third VCSRs and drives a current through the two series combinations of VCSRs. The current results in a voltage drop across the VCSRs dependent on the input high voltage $V_{HV}$. Thus, provided the reference current $I_{REF}$ is known, the input high voltage can be determined from the output voltage $V=V_P-V_N$ in a similar manner as above. One skilled in the art would appreciate that certain calibrations may be required to extract a reliable value for $V_{HV}$ given V and $I_{REF}$, although precise details of any one particular method are not detailed here. One skilled in the art would know how to perform such calibrations having knowledge of the present disclosure.

Figure 3D:
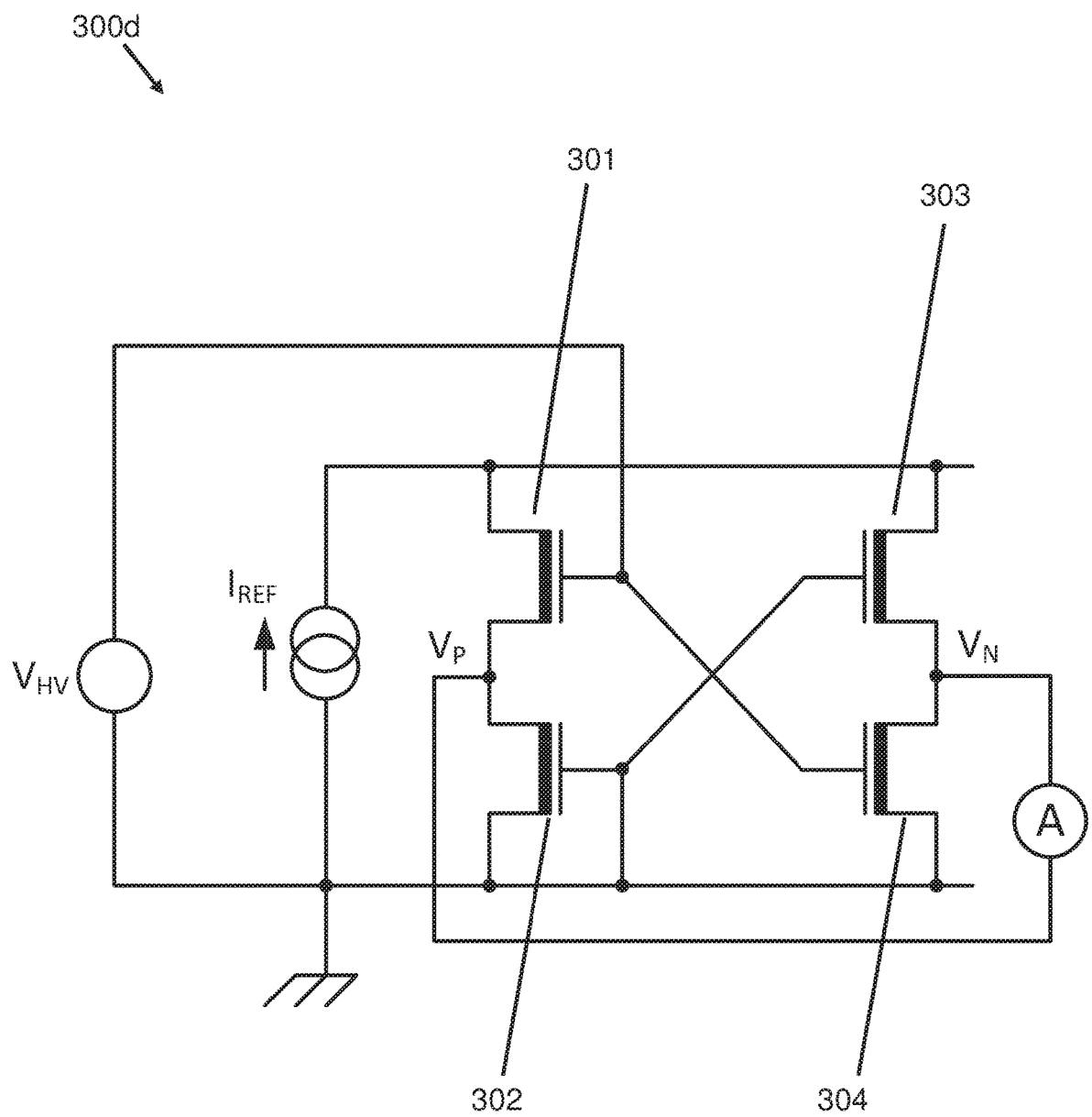
FIG. 3d shows a high-voltage measurement circuit according to an embodiment of the present invention.

FIG. 3d illustrates another variation on the sensing circuit of FIG. 3a. The circuit 300d is the same as that of FIG. 3c except that instead of measuring an output voltage $V=V_P-V_N$, the output is derived from the current flowing between the point between the first and second VCSRs and the point between the third and fourth VCSRs, similar to what is illustrated in FIG. 3b.

Figure 3E:
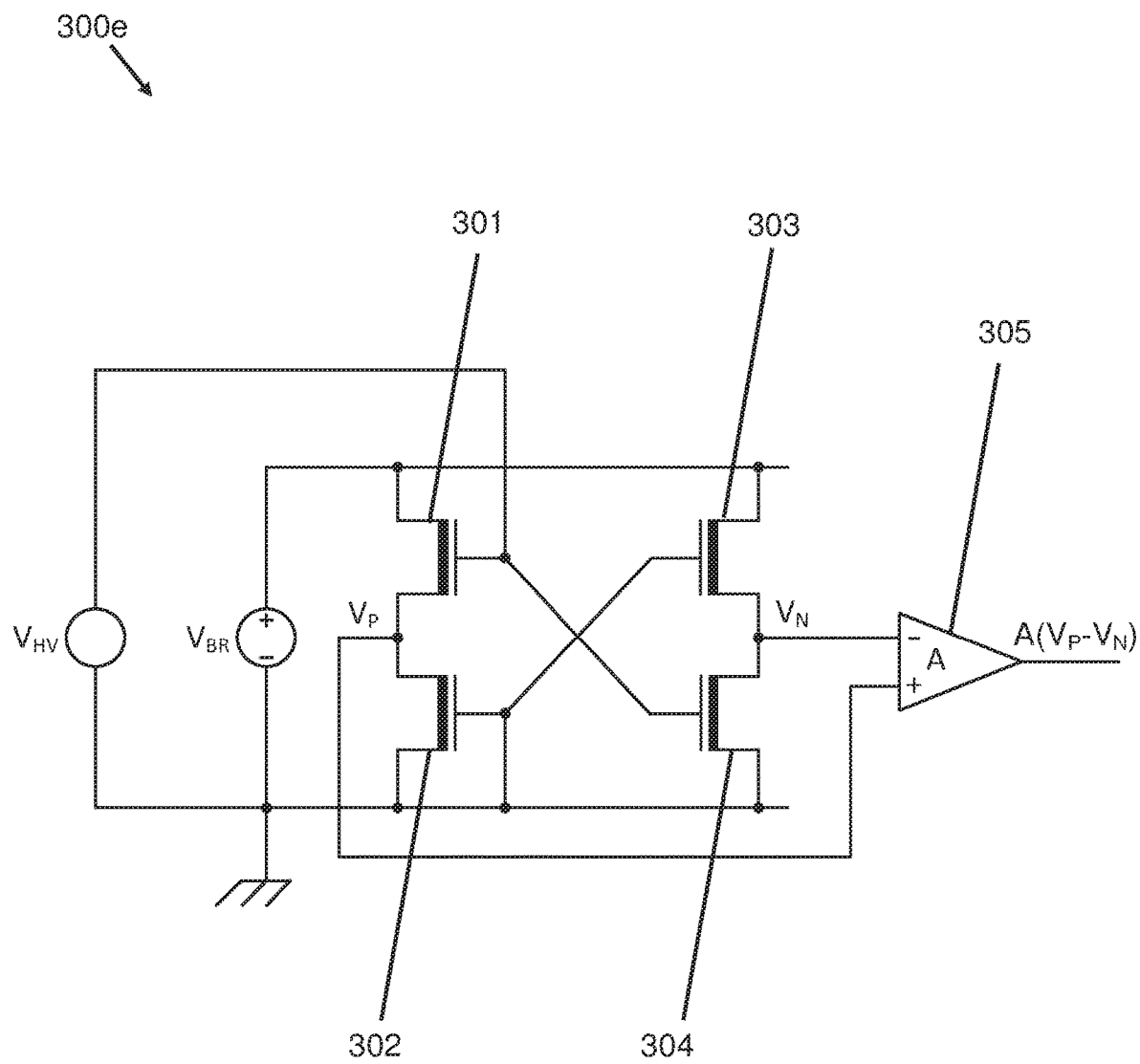
FIG. 3e shows a high-voltage measurement circuit according to an embodiment of the present invention.

FIG. 3e illustrates an extension of the sensing circuit 300e of FIG. 3a, where the voltages $V_P$ and $V_N$ are applied at the positive and negative inputs respectively of a differential amplifier providing a voltage gain A. The output voltage of the amplifier is thus $A(V_P-V_N)$. The use of a differential amplifier to derive the output voltage of the sensing circuit is particularly advantageous because it may allow smaller changes in the input high voltage to be detected. Furthermore, it provides an additional degree of isolation between the sensing circuit and downstream devices. A similar arrangement, using a differential amplifier, may be used in conjunction with the circuit of FIG. 3c.

Figure 3F:
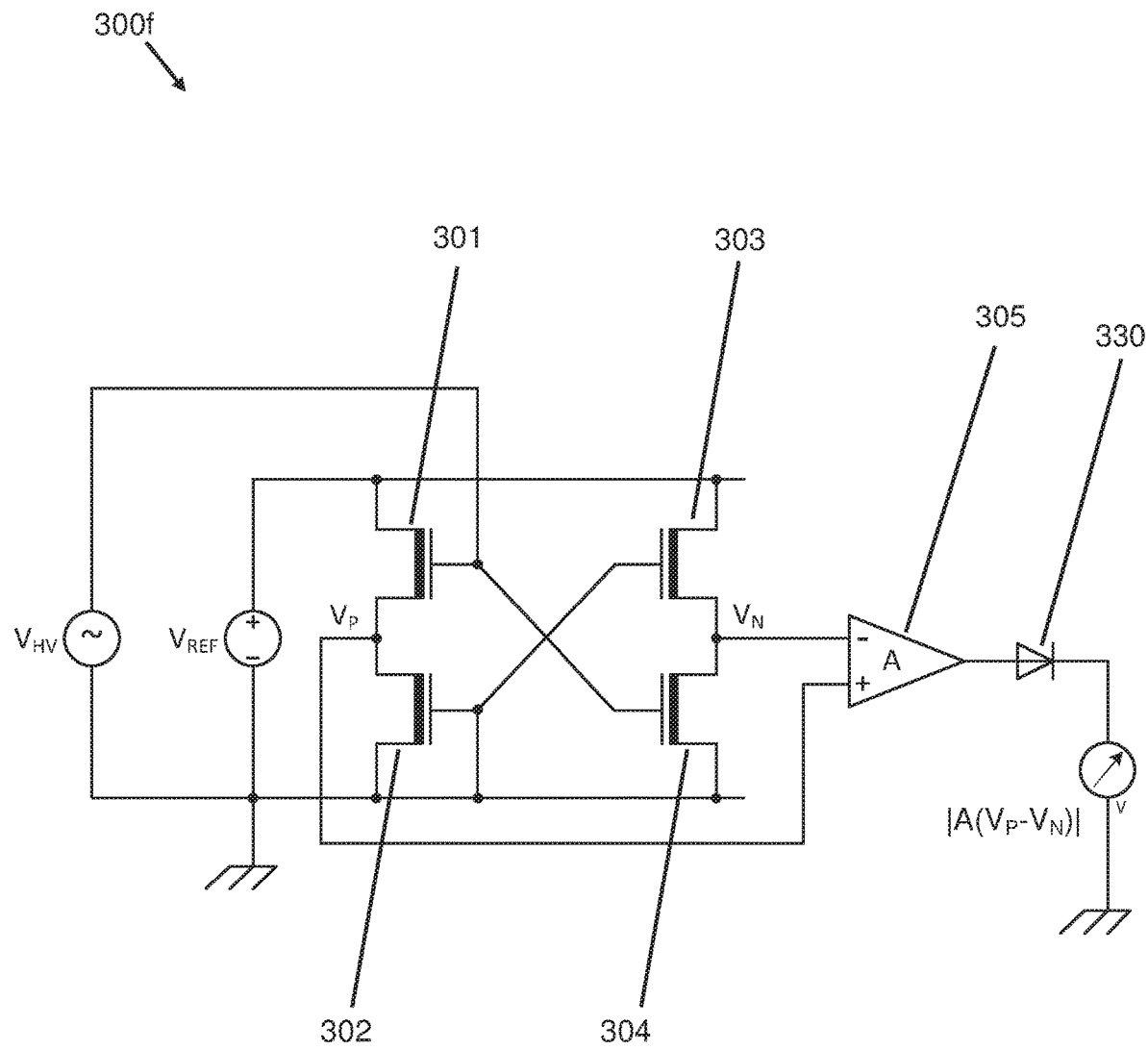
FIG. 3f shows a high-voltage measurement circuit according to an embodiment of the present invention.

FIG. 3f illustrates a variation on the sensing circuit of FIG. 3e whereby a diode 330 (rectifier) is placed between the output of the differential amplifier and the voltmeter. The diode rectifies the output of the amplifier thus ensuring that only a positive voltage $|A(V_P-V_N)|$ is registered by the voltmeter. The circuit 300f of FIG. 3f could be used to sense both input high DC voltages and input high AC voltages, and therefore is potentially more versatile than the circuit of FIG. 3e which does not include a rectifying element in the output. Capacitors (not shown) may be used in addition to the diode 330 to smooth the rectified output, which may be beneficial in certain applications. A rectifying arrangement similar to the one illustrated in FIG. 3f may be used in conjunction with any of the circuits shown in FIGS. 3a-3e, 3g, 3h and 4a-4b.

Figure 3G:
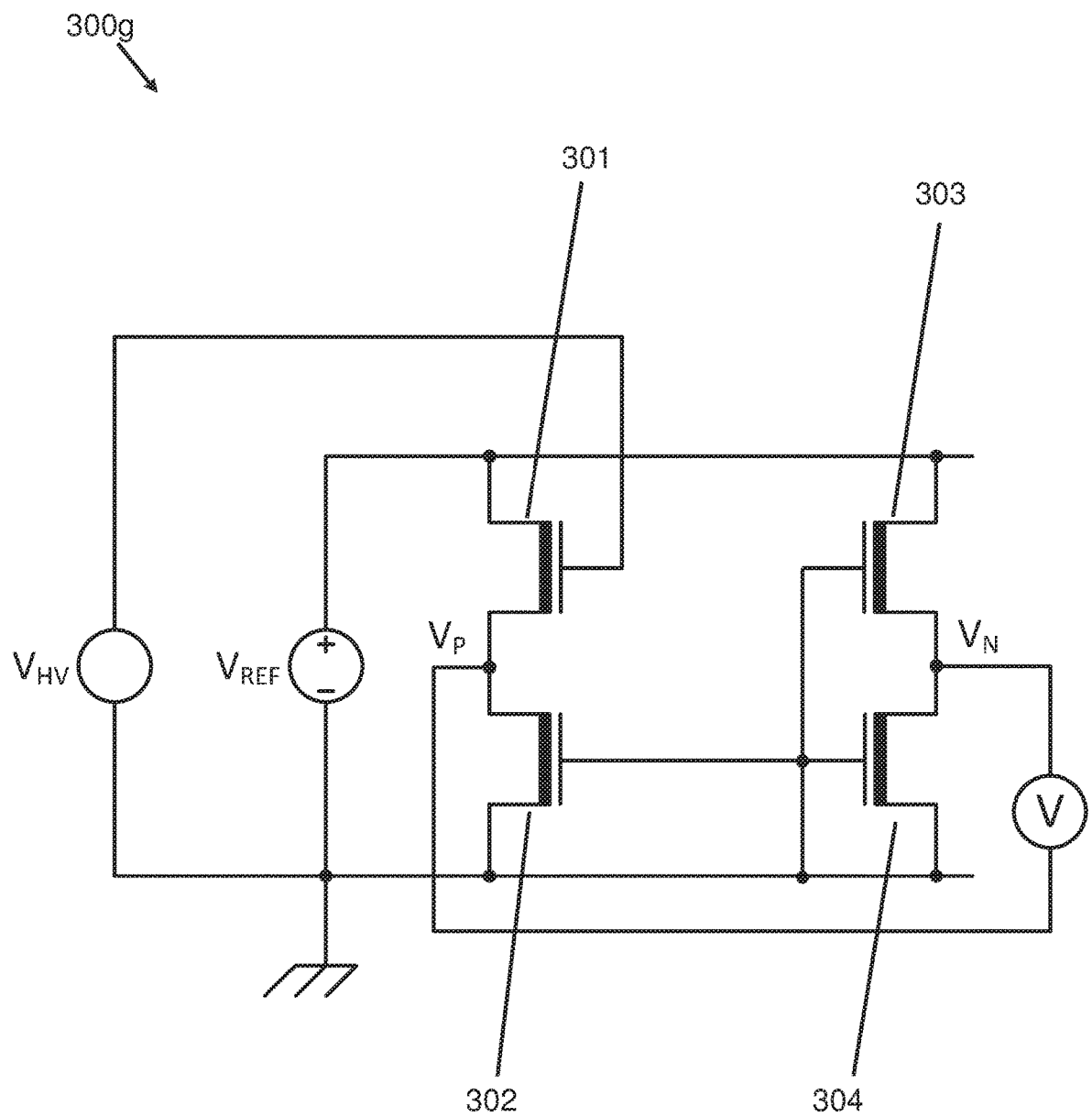
FIG. 3g shows a high-voltage measurement circuit according to an embodiment of the present invention.

FIG. 3g illustrates another variation on the sensing circuit of FIG. 3a, where the high voltage source developing a high voltage $V_{HV}$ is connected only to the gate of the first VCSR 301. The gates of the second, third and fourth VCSRs are all connected to the same low potential, e.g. ground. In this configuration, the series combination of the third and fourth VCSRs is acting only as a voltage divider, and the voltage $V_N$ is not dependent on the input high voltage. The concept illustrated in FIG. 3g has been shown for the case where the circuit 300g comprises a reference voltage source and an output voltage of the circuit is measured. However, variations on the circuit of FIG. 3g in which the reference voltage source is replaced by a reference current source and/or the output voltage measurement is replaced by an output current measurement (as in the circuits of FIGS. 3b-3d) are also contemplated, but are not illustrated explicitly within the present application. The sensing circuit of FIG. 3g could also be adapted to use a differential amplifier to provide the output voltage rather than a voltmeter, e.g. an output arrangement similar to that shown in FIG. 3e/3f.

Figure 3H:
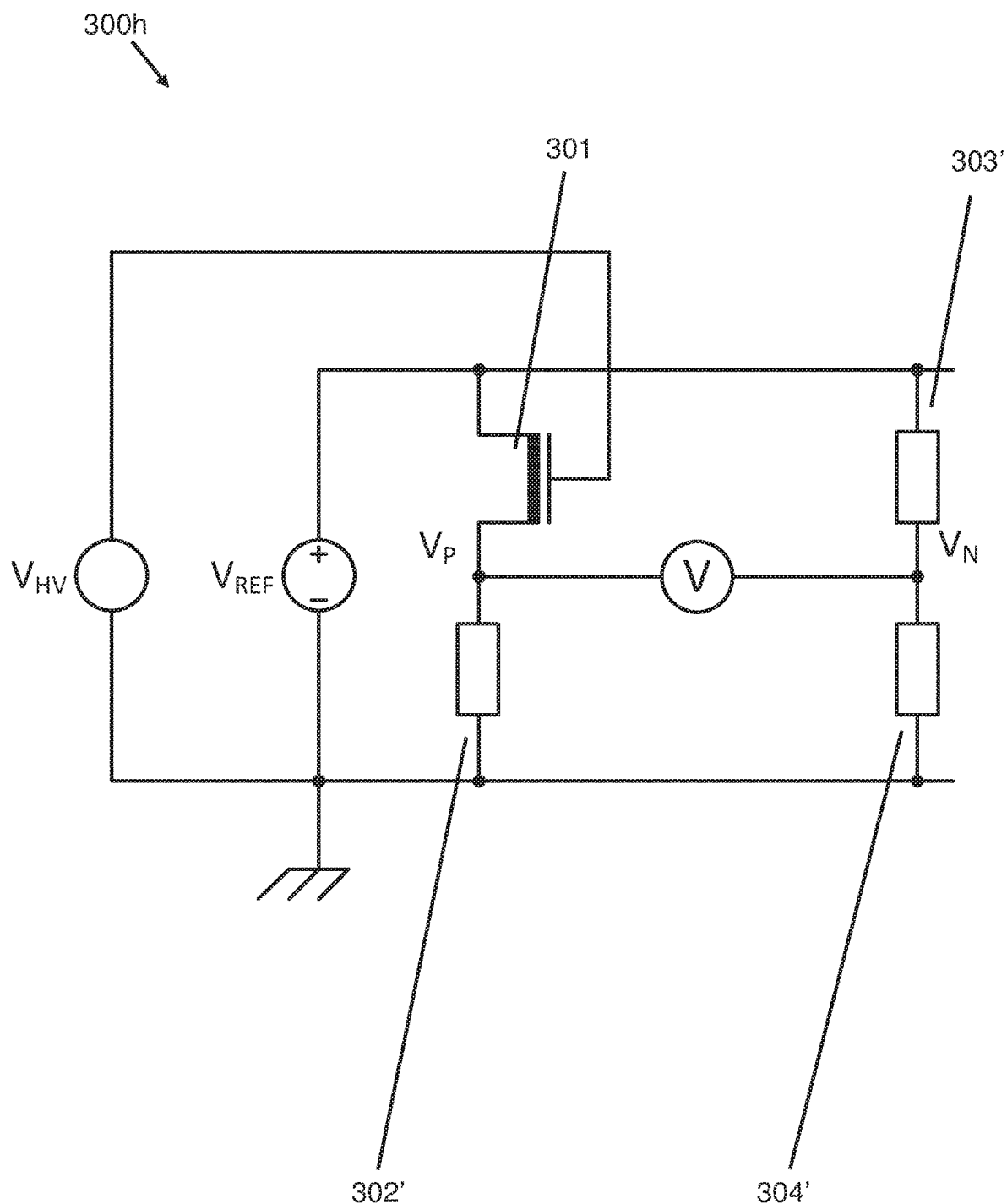
FIG. 3h shows a high-voltage measurement circuit according to an embodiment of the present invention.

FIG. 3h illustrates a variation on the sensing circuit of FIG. 3g, where the second, third and fourth VCSRs, 302-304, are replaced by resistors not including a gate, 302'-304', e.g. semiconductor well resistors or polycrystalline semiconductor resistors. Since the high voltage source is only connected to the first VCSR 301 it is not necessary to use VCSRs for the other three resistors. The circuit 300h shown in FIG. 3h may be adapted to borrow certain concepts from any one of the circuits of FIGS. 3b-3f, e.g. using a differential amplifier to provide the output voltage rather than a voltmeter.

In all the sensing circuits of FIGS. 3a-3h each of the VCSRs may be a voltage-controlled semiconductor well resistor or a polycrystalline voltage-controlled semiconductor resistor. It may be advantageous to use substantially identical resistors, e.g. all VCSRs are voltage-controlled semiconductor well resistors, in order to ensure the balance and performance of the circuit is optimal. However, this is not a necessary requirement and the sensing circuits would operate also with a mixture of different types of VCSRs. In general, the VCSRs could comprise any of:

1. n or p-doped wells below shallow trench isolation (STI) or field oxide (FOX); or
2. n or p-doped wells below active regions, without STI or FOX (may allow more well doping to reach the semiconductor substrate); or
3. n or p-doped polycrystalline material.

In order to avoid systematic output offset error voltages in sensing circuits described above (due to parametric gradients in the integrated circuit) it is desirable for the high voltage sensing elements (e.g. 301 and 304) of the bridge and the low voltage reference elements (e.g. 302 and 303) of the bridge to be of the same type, layout and located as close as possible to each other. However, electric field coupling from the high voltage elements to low voltage elements and the output signal metal tracks should desirably be avoided. The cross coupling problem is most pronounced when the output signals are very sensitive to electric fields, e.g. because the output signals have only small amplitudes (on the order of mV, for example) and/or are high impedance.

Figure 4A:
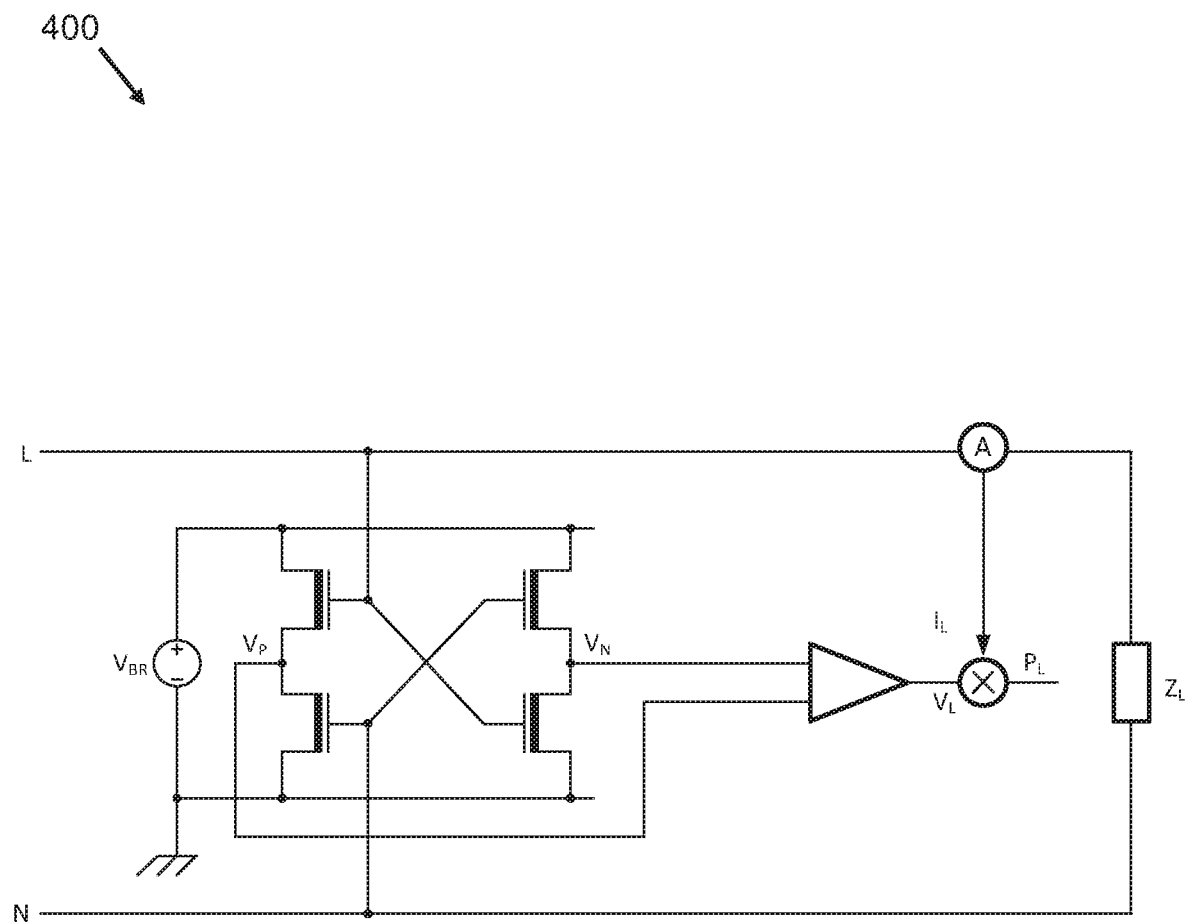
FIG. 4a shows a power meter circuit according to an embodiment of the present invention.
Figure 4B:
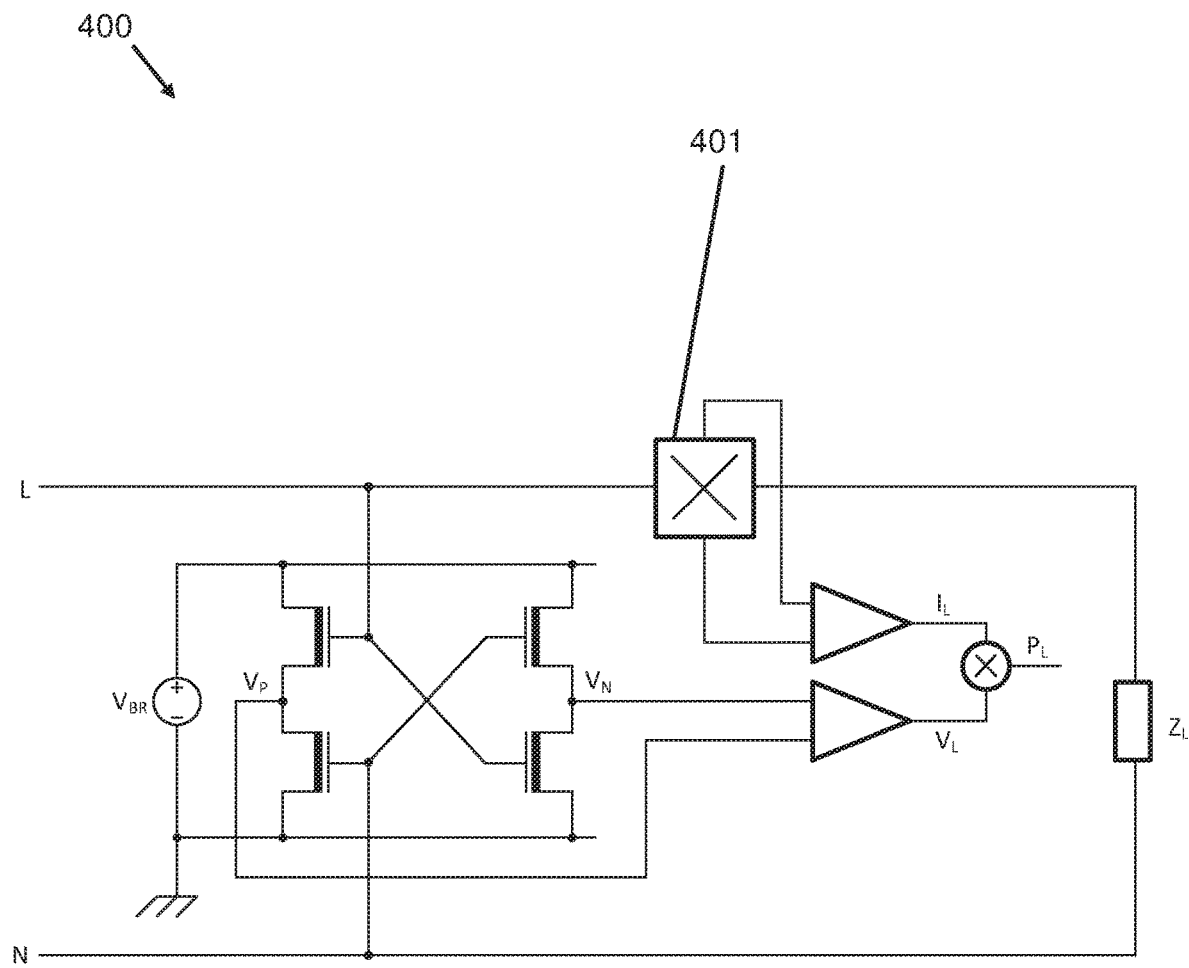
FIG. 4b shows a power meter circuit according to an embodiment of the present invention.

FIG. 4a illustrates a circuit schematic of a power meter according to an embodiment of the present invention. The circuit comprises the high voltage sensing circuit of FIG. 3e, which provides an output voltage $V_L$ indicative of the output voltage of a high voltage power supply connected between points L and N. The ground potential internal to the high voltage sensing circuit may be different from the potential at point N in this configuration. For example, the potential at point N may be the negative of the potential at point L with respect to the ground potential, where the voltage applied to the first and third VCSRs is $V_{BR}$ with respect to the ground potential. The high voltage power supply is connected to some load, represented by an impedance $Z_L$. The load may be an electric motor, for example. The load draws a current from the high voltage power supply which is sensed by a current sensing device A in series with the load $Z_L$. An output $I_L$ is provided by the current sensing device which is indicative of the current flowing through the load $Z_L$. This output is multiplied with the output of the high voltage sensing circuit $V_L$ to obtain an output $P_L$ indicative of the instantaneous power the load $Z_L$ is drawing from the high voltage power supply. The power meter has little or no impact on the high voltage power supply in terms of current drain since there is galvanic isolation between the power supply and the output of the voltage sensing circuit. FIG. 4b shows a particular implementation of the power meter concept of FIG. 4a where the current drawn from the high voltage source by the load $Z_L$ is sensed using a Hall-effect current sensor 401. Although the power meter circuits of FIGS. 4a and 4b both use the high voltage sensing circuit of FIG. 3e, it would be appreciated by one skilled in the art that the power meter could also function based on any one of the circuits of FIGS. 3a to 3h.

Figure 5A:
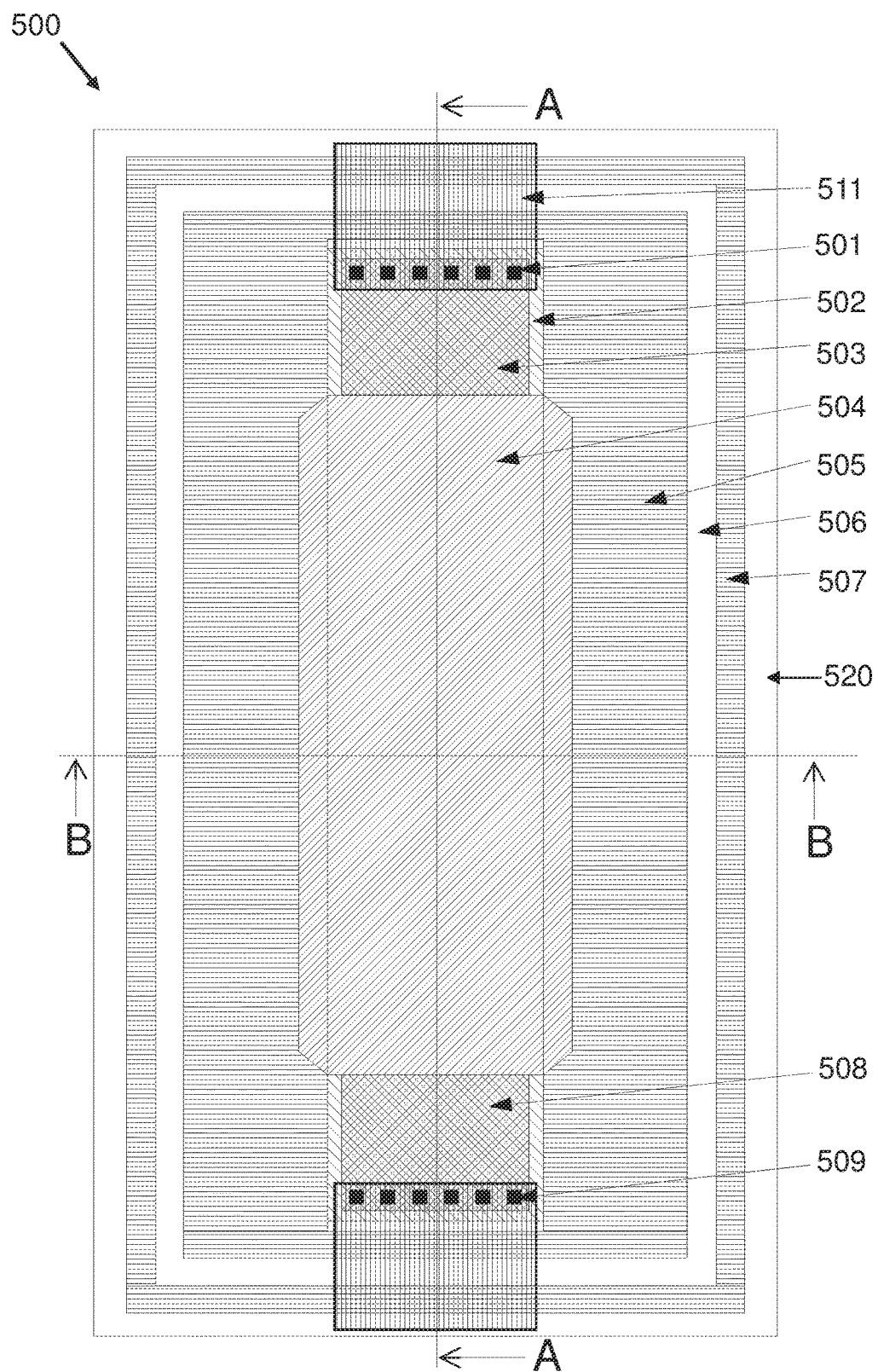
FIG. 5a shows a semiconductor device according to an embodiment of the present invention.
Figure 5B:
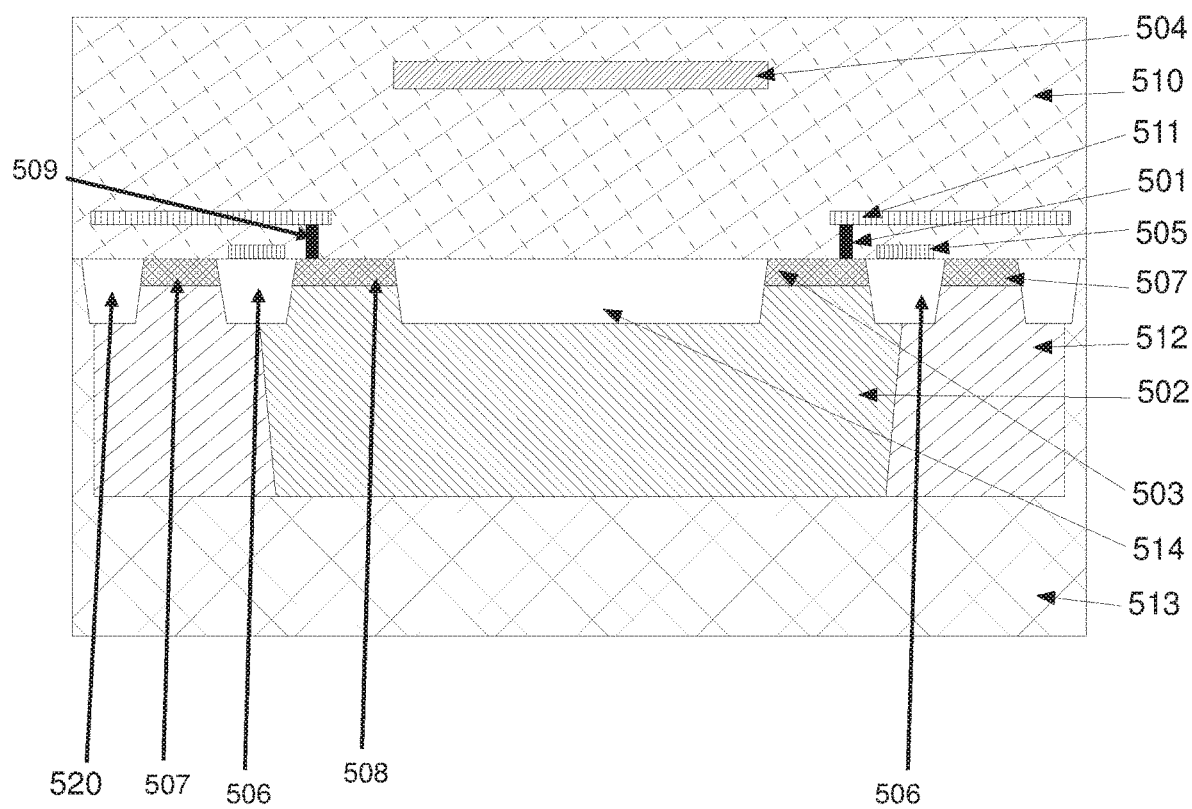
FIG. 5b shows a semiconductor device according to an embodiment of the present invention.
Figure 5C:
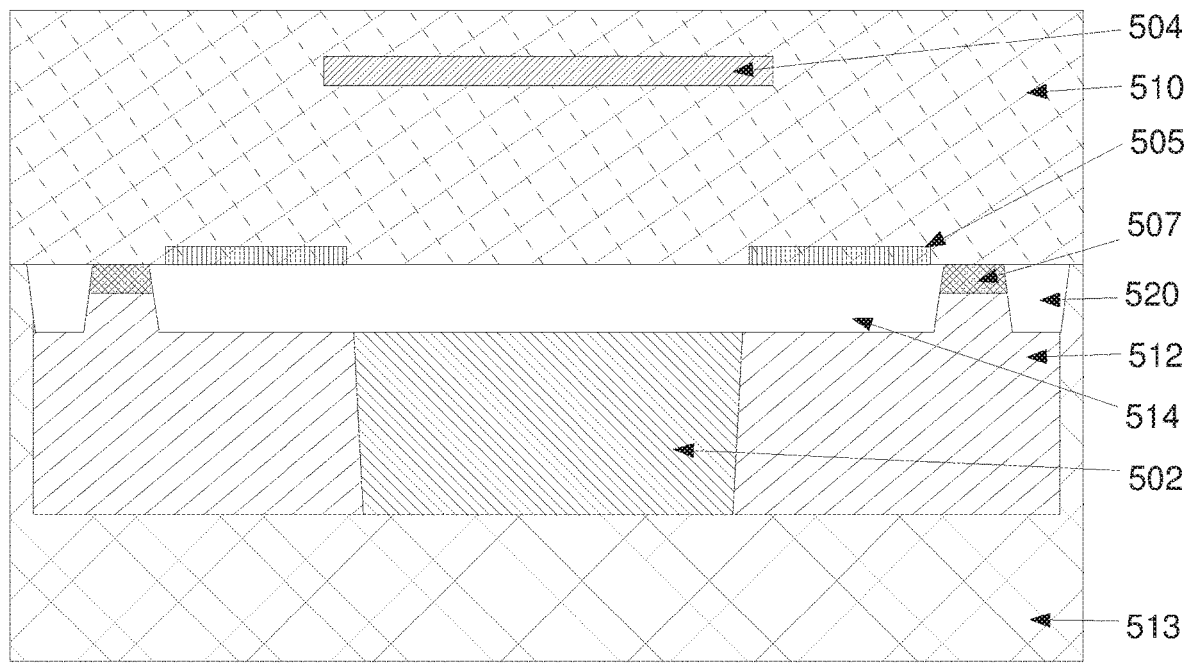
FIG. 5c shows a semiconductor device according to an embodiment of the present invention.

FIGS. 5a-5c illustrate an n-type voltage-controlled semiconductor well resistor 500 according to an embodiment of the present invention, whereby FIG. 5a shows a top-down view, FIG. 5b shows a cross section cut through the line A-A in FIG. 5a, and FIG. 5c shows a cross section cut through the line B-B in FIG. 5a. The device 500 is structured as follows. The basis of the device is a p-type semiconductor wafer 513 in which is formed an n-type well 502 which extends into the substrate in a localized region of approximately rectangular profile when the device is viewed from above. The n-type well 502 is surrounded laterally on all sides by a p-type well 512 which extends a similar depth into the substrate as the n-type well. The device has mirror symmetry in two orthogonal planes which are perpendicular to the substrate and intersect each other at the centre of the n-type well.

A first shallow-trench isolation (STI) region 514 is formed on top of the n-type and p-type regions in such as manner that in a 'first' cross section (A-A, FIG. 5b) the first STI region extends only over a portion of the n-type region and not at all over the p-type region whilst in the orthogonal, 'second', cross section (B-B, FIG. 5c) the STI region extends over the whole n-type region and some of the p-type region. When viewed in the first cross section, the regions of the n-type well 502 which are not covered by the STI region 514 are covered on either side by silicide diffusion (n+) regions 503, 508 which form the terminals of the resistor. Extending vertically out of each of these terminals are metal contacts 501, 509 leading to metal tracks 511. Also, when viewed in the first cross section, positioned laterally outwards from the two silicide diffusion regions is a second STI region 506 and still further laterally outwards is a silicide diffusion (p+) region 507. Outside of the silicide diffusion region 507 is a final, third STI region 520 which surrounds the rest of the device. In the second cross section, laterally outward of the first STI region 514 is the silicide diffusion region (p+) 507. A polycrystalline layer 505 is situated on top of the outer regions of the first STI region when viewed in the second cross section. When viewed in the first cross section, this same polycrystalline layer is situated on top of the second STI region only. Thus the polycrystalline layer 505 forms a ring. This polycrystalline layer acts a shield, as is described in more detail below. The device region above the polycrystalline shield is filled with an inter-layer dielectric (ILD) 510, e.g. silicon dioxide. A gate electrode 504 is positioned in the ILD. In the first cross section, the gate electrode has approximately the same width at the first STI region, whilst in the second cross section the gate electrode has approximately the same width as the region of the first STI region which is not covered by the polycrystalline shield 505. Thus the polycrystalline shield surrounds a region of the device ILD between the n-type well 502 and the gate electrode 504. The gate electrode 504 has a small lateral overlap with the polycrystalline shield 505 according to this embodiment (as shown in FIG. 5c), although devices where there is no such overlap are also contemplated. When viewed from above (FIG. 5a) the polycrystalline shield 505, second STI region 506 and the silicide diffusion (p+) region 507 completely surround the inner part of the device which comprises the gate, n-type well and contacts.

In summary, an n-type well region 502 is formed under shallow trench isolation (STI) 514 in a p-doped wafer 513 with connections 501, 509 to its two terminals formed by means of silicided N-type diffusion regions 503 and 508. A metal gate 504 is formed in the inter-layer dielectric 510 at a certain height above the first STI region 514 to control the conductivity in the resistor region 502 (n-type well region below STI). A polycrystalline shield plate 505 is formed surrounding (and in this embodiment overlapping with) the n-type well resistor region 502 to prevent parasitic field inversion due to high electric field strength.

Figure 5D:
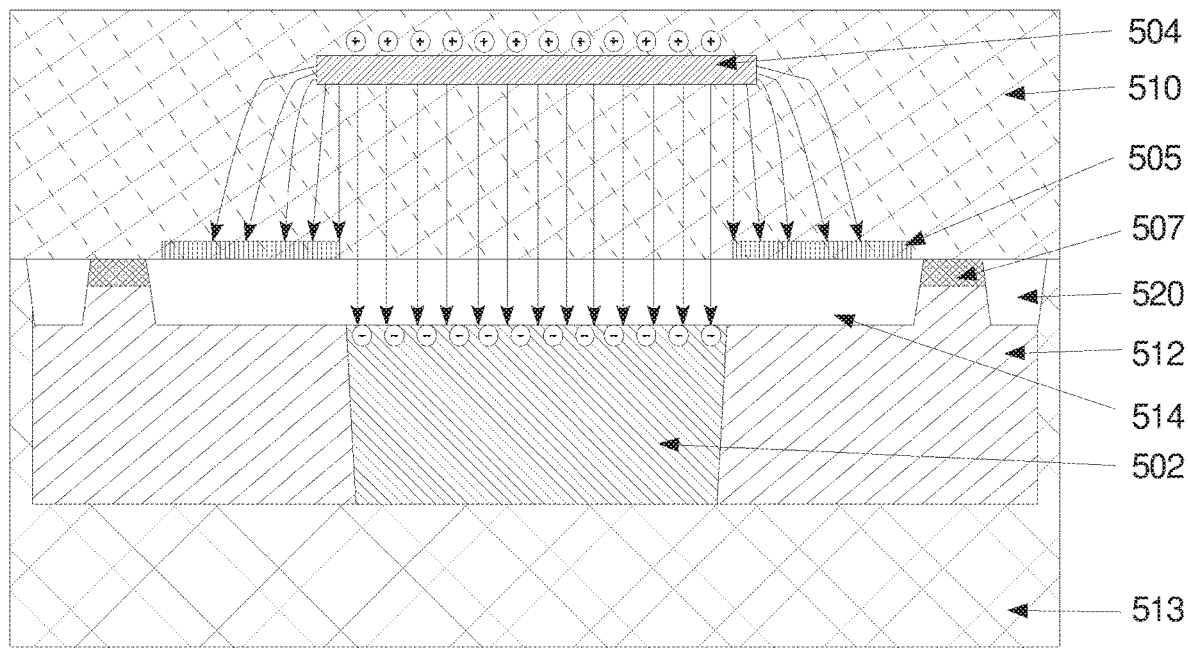
FIG. 5d shows a semiconductor device according to an embodiment of the present invention.
Figure 5E:
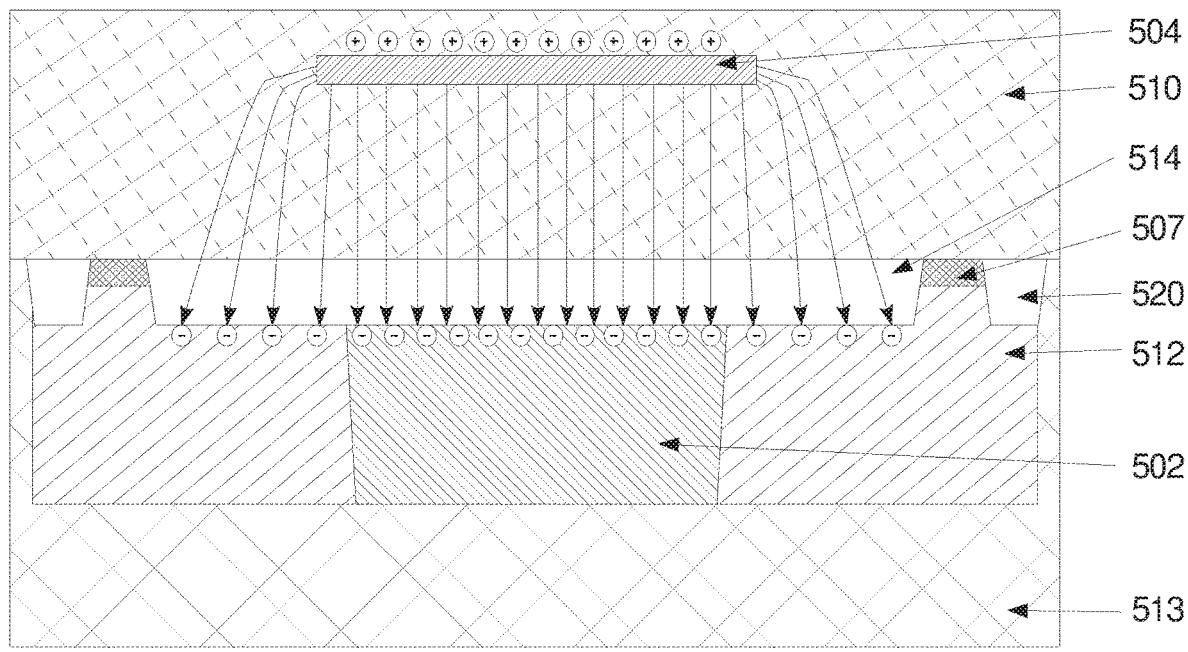
FIG. 5e shows a semiconductor device according to an embodiment of the present invention.

The effect of the polycrystalline shield 505 is illustrated in FIGS. 5d and 5e which (schematically) show a possible distribution of electric field lines emanating from the gate electrode 504 in the presence (FIG. 5d) and absence (FIG. 5e) of the polycrystalline shield 505. As can be seen in FIG. 5d, the shield provides a termination for the electric field emanating from laterally-outward regions of the gate electrode, thereby partially or completely preventing the electric field from penetrating the p-type well 512. In the absence of the shield, FIG. 5e, the electric field does penetrate the active silicon area (p-type well 512) leading to a concentration of electrons in the surface region. This surface region acts as a conductive channel, which can lead to parasitic current flow from the VCSR to other nodes in the circuit. The polycrystalline shield 505 presents a termination of the electric field generated by the ultra-high voltage input signal. Therefore, the polycrystalline shield 505 prevents the electric field of the ultra-high voltage input signal from penetrating the silicon substrate and therefore from creating unwanted parasitic inversion channels. The polycrystalline shield 505 is connected to a low-impedance reference source by means of a connector (not shown). For example, the polycrystalline shield may be connected directly to ground.

This polycrystalline shield 505 is beneficial to prevent parasitic current flow between the resistor region 502 and adjacent circuit parts. The polycrystalline shield plate 505 surrounds a region of the ILD 510 between the gate 504 and the well 502 of the voltage-controlled semiconductor well resistor. Preferably the footprint of the gate falls within the footprint of the shield, where the footprint is defined as the projection as viewed along a direction perpendicular to a main surface of the gate. The thickness of the ILD is chosen when designing the voltage-controlled semiconductor well resistor such that the device has desired characteristics in terms of the sensitivity and the maximum voltage which the device can withstand applied to the gate thereof. The sensitivity of the device is the change in resistance of the well region as a function of the applied gate voltage. According to an embodiment, the voltage-controlled semiconductor well resistor can withstand a voltage of up to approximately 2500 V applied at the gate, and the thickness of the ILD region is 10 µm. For a maximum voltage of 1500 V, a reduced ILD thickness of 6 µm may be appropriate.

Figure 5F:
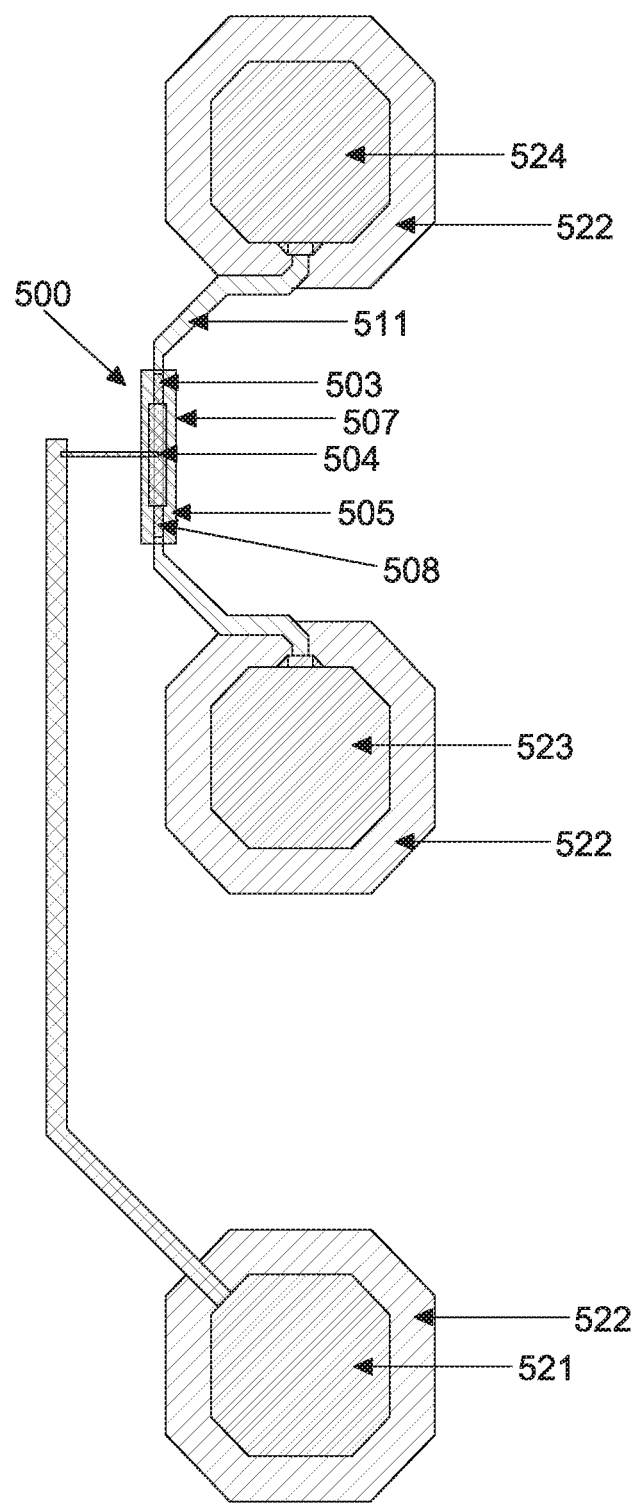
FIG. 5f shows a semiconductor device according to an embodiment of the present invention.
Figure 5G:
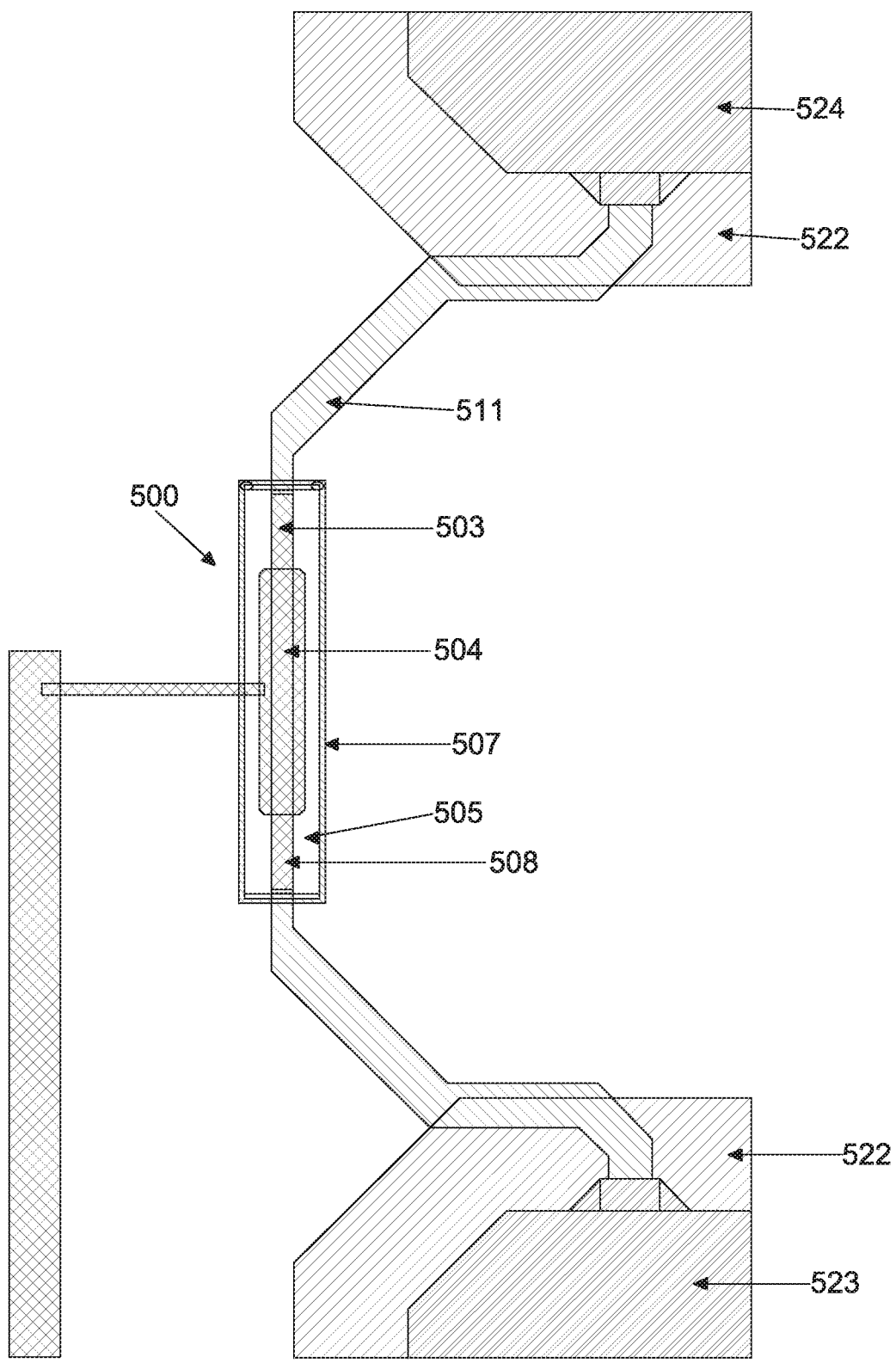
FIG. 5g shows a semiconductor device according to an embodiment of the present invention.

The voltage-controlled semiconductor well resistor may also comprise a polyimide re-passivation layer, a concept which is illustrated in FIGS. 5f and 5g. The re-passivation layer is beneficial when a circuit comprising one or more voltage-controlled semiconductor well resistors is connected to the outside world by test probes (during production testing to ensure the high voltage robustness of the metal gates, for example). This layer significantly shifts the onset of electric arcs between adjacent high voltage and low voltage probe needles to higher voltages without the need to increase the pad spacing to impractical values. In FIG. 5f, an n-type voltage-controlled semiconductor well resistor 500 is shown in addition to three pads for connecting external probes to the resistor. Item 521 is the gate electrode test pad, and items 523 and 524 are the resistor terminal test pads. 522 is a re-passivation layer exclusion zone which surrounds test pads 521, 524 and 523. Substantially the remainder of the integrated circuit is covered with the re-passivation layer. The pads are connected with metal tracks to the silicided contact regions of the n-type voltage-controlled semiconductor well resistor. Although the re-passivation layer and test pads have been illustrated for the case of the n-type voltage-controlled semiconductor well resistor the inventors have appreciated that the same concepts also apply to the p-type voltage-controlled semiconductor well resistor. FIG. 5g is an enlarged view of part of FIG. 5f. The complete circuit may be covered with the polyimide except the pad regions and the exclusion regions 522 surrounding the pad regions. One skilled in the art, having knowledge of this disclosure, would know how to fabricate the polyimide re-passivation layer and thus specific details are not provided herein. The inventors have also appreciated that the re-passivation layer concept also applies to other types of VCSRs such as polycrystalline VCSRs.

Figure 6A:
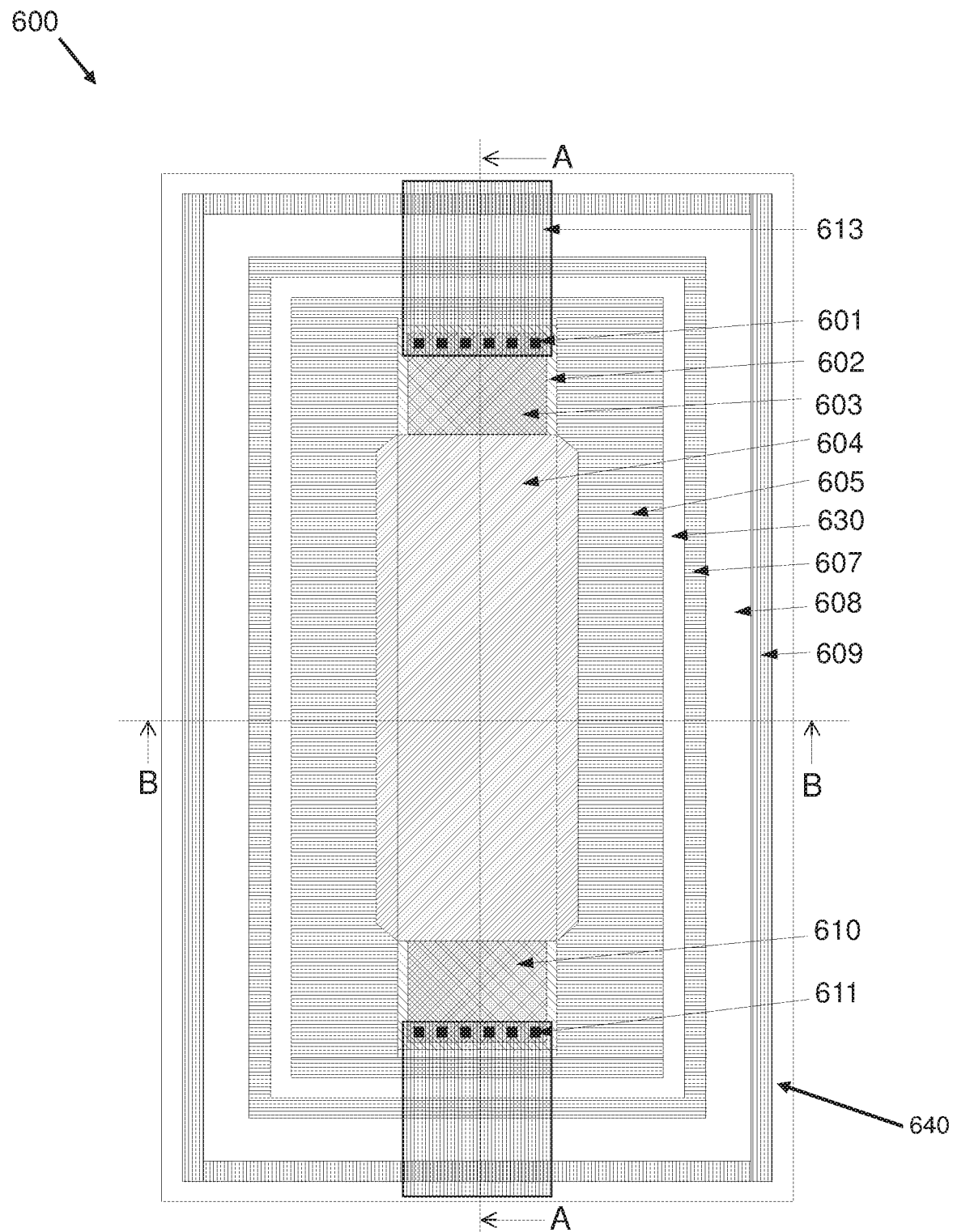
FIG. 6a shows a semiconductor device according to an embodiment of the present invention.
Figure 6B:
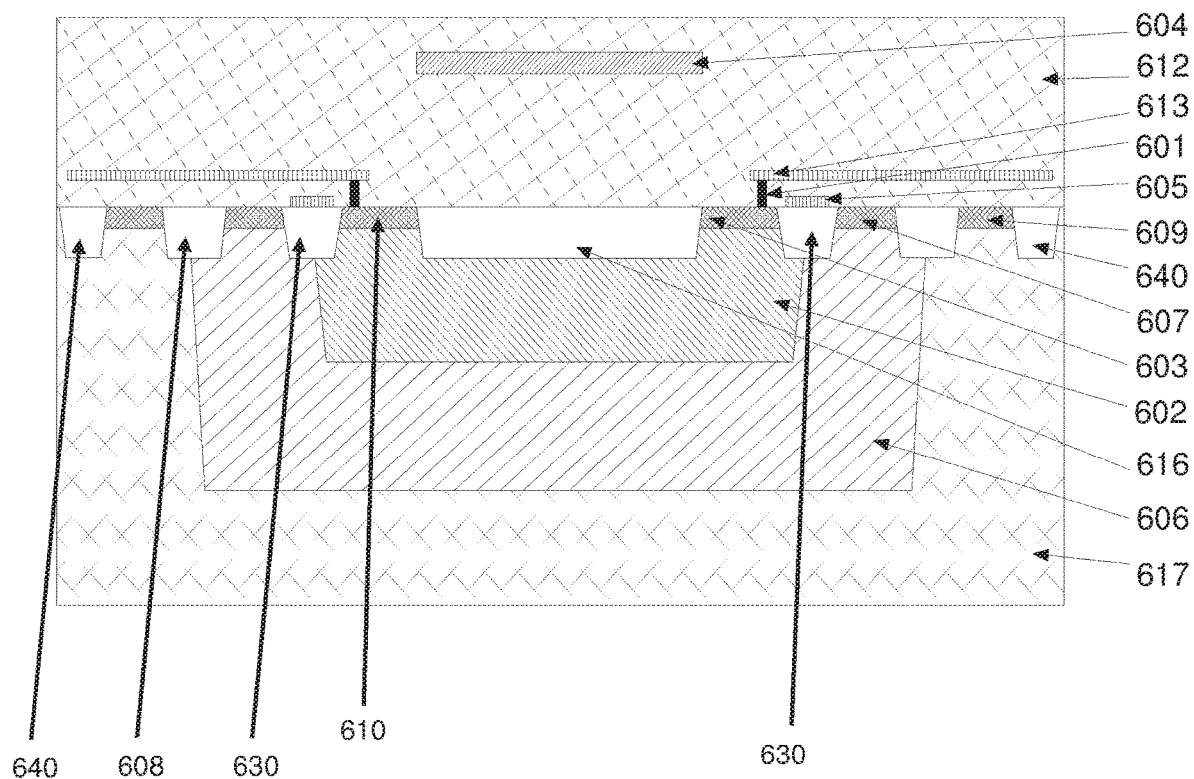
FIG. 6b shows a semiconductor device according to an embodiment of the present invention.
Figure 6C:
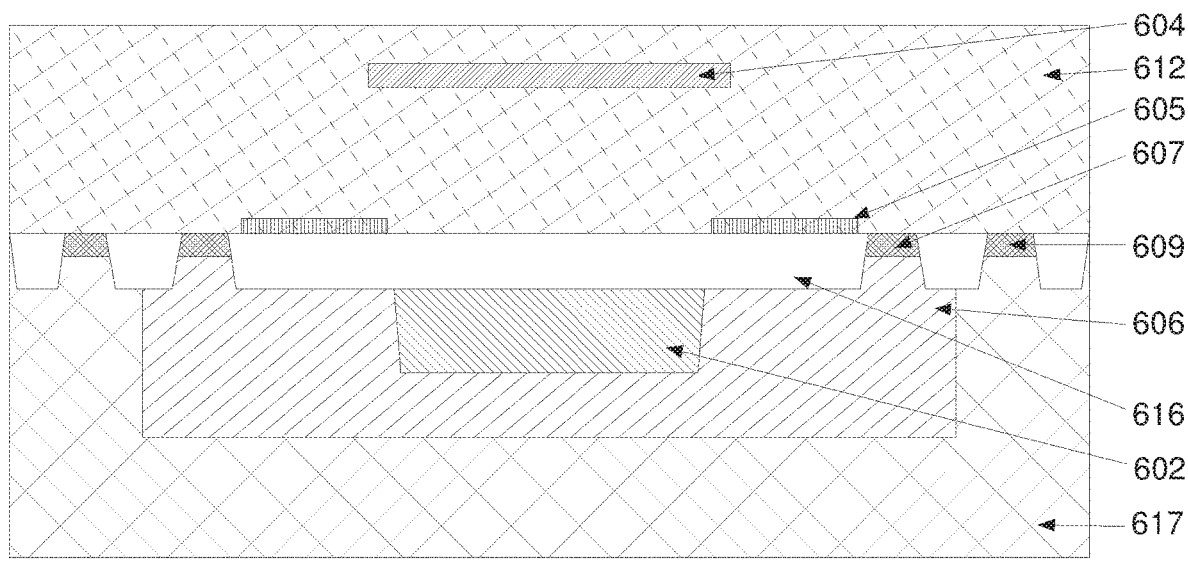
FIG. 6c shows a semiconductor device according to an embodiment of the present invention.

FIGS. 6a-6c illustrate a p-type voltage-controlled semiconductor well resistor 600 according to an embodiment of the present invention. FIG. 6a shows the top view of the well resistor, FIG. 6b shows the cross section through the L-edge (cut A-A in FIG. 6a) and FIG. 6c shows the cross section through the W-edge (cut B-B in FIG. 6a).

The device is broadly similar to the n-type voltage-controlled semiconductor well resistor illustrated in FIGS. 5a-5c. The device 600 is structured as follows. The basis of the device is a p-type semiconductor wafer 617 in which is formed a deep n-type well 606 which extends into the substrate in a localized region of approximately rectangular profile when the device is viewed from above. An isolated p-type well 602 is situated inside the deep n-type well such that it is surrounded by the n-type well 606 on all sides. The device has mirror symmetry in two orthogonal planes which are perpendicular to the substrate and intersect each other at the centre of the p-type well 602. A first shallow-trench isolation (STI) region 616 is formed on top of the n-type and p-type wells in such a manner that in a 'first' cross section (A-A, FIG. 6b) the first STI region 616 extends only over a portion of the p-type well 602 and not at all over the topmost portions of the isolated n-type well 606 whilst in the orthogonal, 'second', cross section (B-B, FIG. 6c) the first STI region 616 extends over the whole p-type well 602 and most of the isolated n-type well 606. When viewed in the first cross section, the regions of the p-type well 602 which are not covered by the first STI region 616 are covered on either side by silicide diffusion (p+) regions 603, 610 which form the terminals of the resistor. Extending vertically out of each of these terminals are metal contacts 601 leading to metal tracks 613. Also, when viewed in the first cross section, positioned laterally outwards from the two silicide diffusion regions 603, 610 is a second STI region 630 which is situated on the boundary between the p-type well 602 and the isolated n-type well 606, and still further laterally outwards is a silicide diffusion (n+) region 607. Still further laterally outwards is a third STI region 608 situated on the boundary between the p-type semiconductor wafer 617 and the deep n-type well 606. Still further laterally outwards is a further silicide diffusion region (p+) 609 and finally a final STI region 640 surrounding the whole device. In the second cross section, laterally outward of the first STI region 616 is the silicide diffusion region (n+) 607. A polycrystalline layer 605 is situated on top of the outer regions of the first STI region 616 when viewed in the second cross section. When viewed in the first cross section, this same polycrystalline layer 605 is situated on top of the second STI region 630 only. Thus the polycrystalline layer 605 forms a ring. This polycrystalline layer acts a shield, as is described in more detail above in connection with FIGS. 5a-5c. The device region above the polycrystalline shield is filled with an inter-layer dielectric (ILD) 612, e.g. silicon dioxide. A gate electrode 604 is positioned in the ILD. In the first cross section, the gate electrode has approximately the same width as the first STI region 616, whilst in the second cross section the gate electrode 604 has approximately the same width as the region of the first STI region 616 which is not covered by the polycrystalline shield 605. Thus the polycrystalline shield 605 surrounds a region of the device ILD 612 between the p-type well 602 and the gate electrode 604. The gate electrode has approximately no lateral overlap with the polycrystalline shield according to this embodiment, although devices where there is some such overlap are also contemplated. When viewed from above (FIG. 6a) the polycrystalline shield 605 completely surrounds the inner part of the device which comprises the gate 604, p-type well 602 and contacts 601, 611.

Figure 7A:
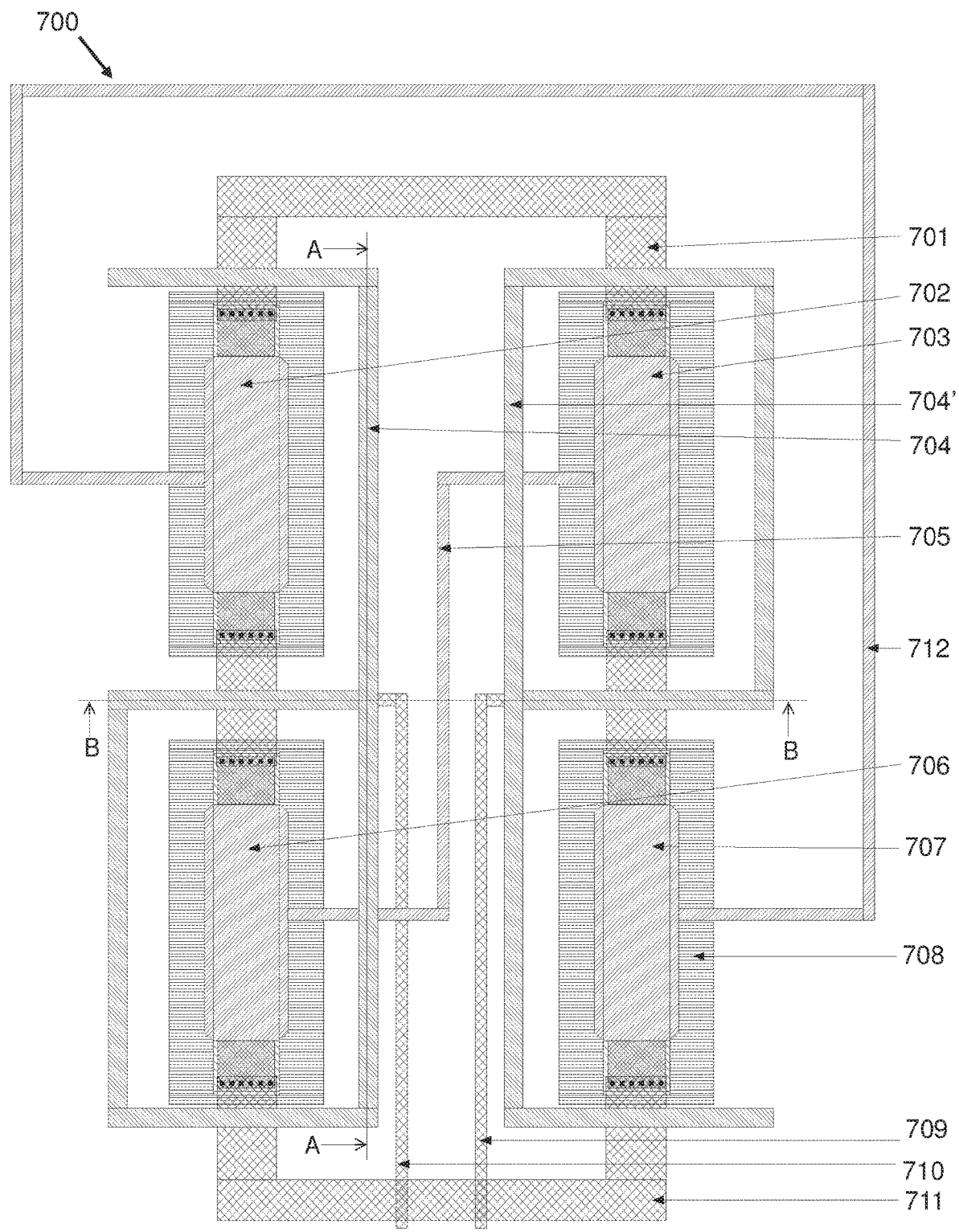
FIG. 7a shows a semiconductor device according to an embodiment of the present invention.

FIG. 7a shows a plan view of a physical implementation of part of any one of the circuits of FIGS. 3a-3f, 4a or 4b. The structure 700 has four voltage controlled semiconductor well resistors 702, 703, 706, 707. 702 and 707 may correspond to components 301 and 304 respectively in FIGS. 3a-3e, i.e. the gates of 702 and 707 are (to be) connected to the high voltage source. The voltage controlled semiconductor well resistors may be those according to FIGS. 5a-5c or FIGS. 6a-6c, for example.

Figure 8A:
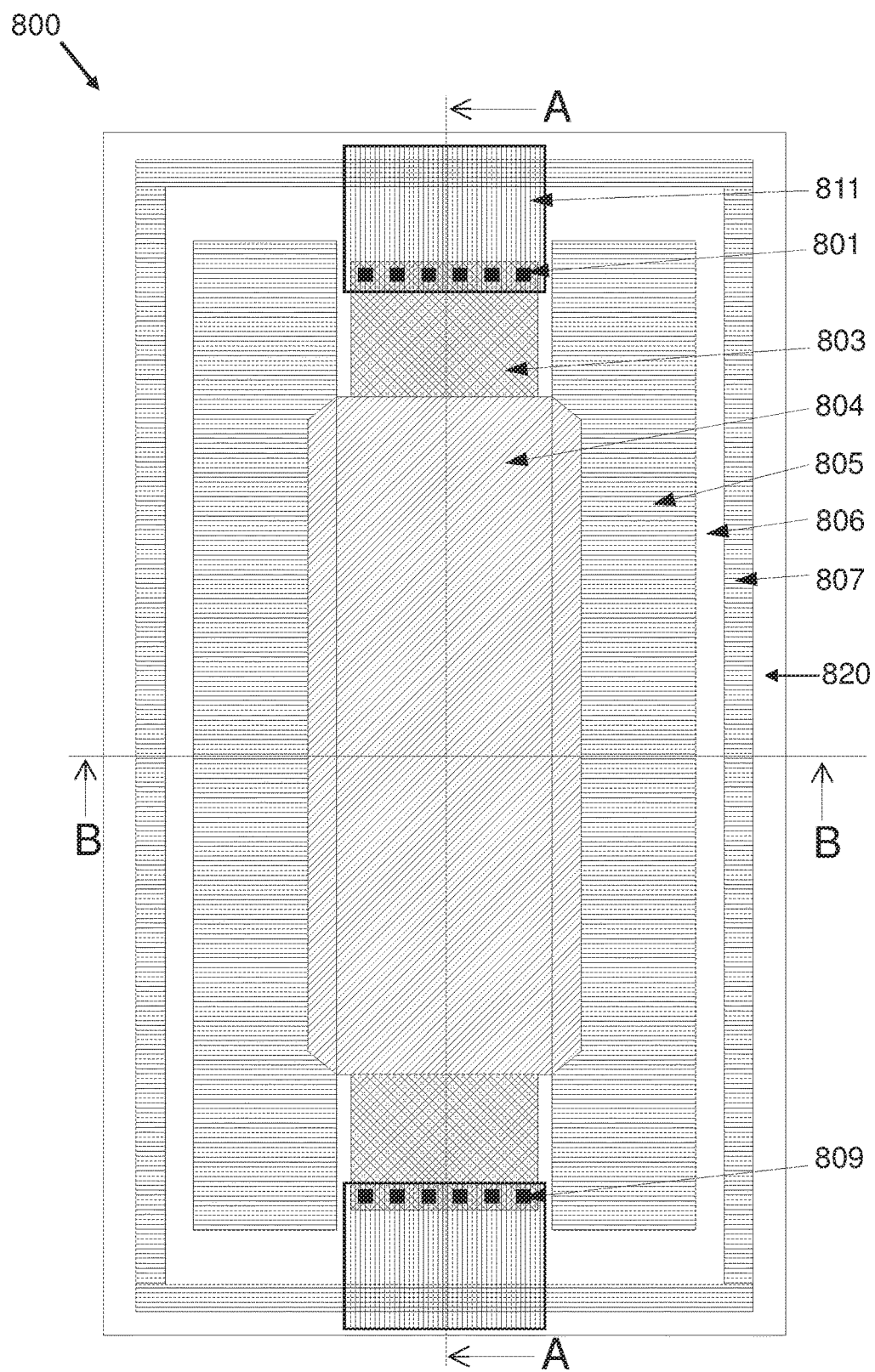
FIG. 8a shows a semiconductor device according to an embodiment of the present invention.
Figure 8B:
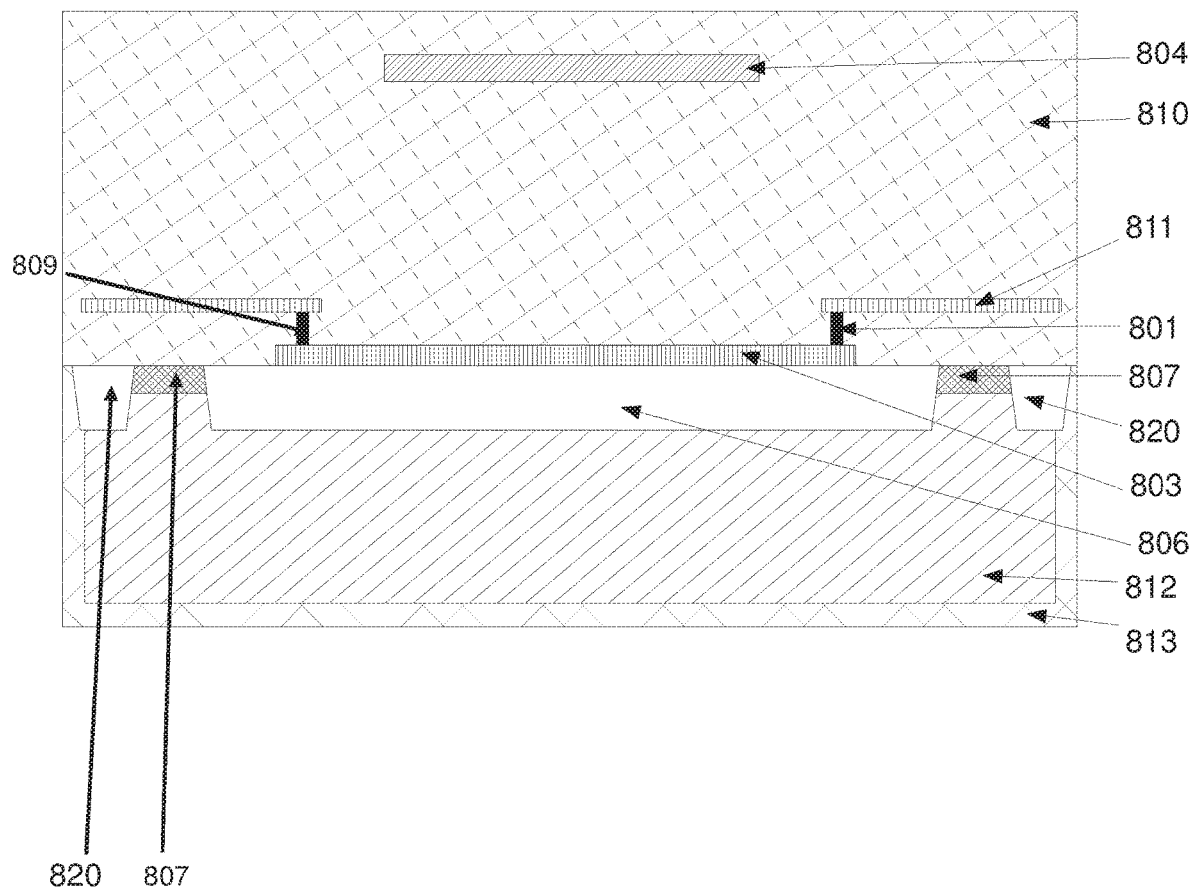
FIG. 8b shows a semiconductor device according to an embodiment of the present invention.
Figure 8C:
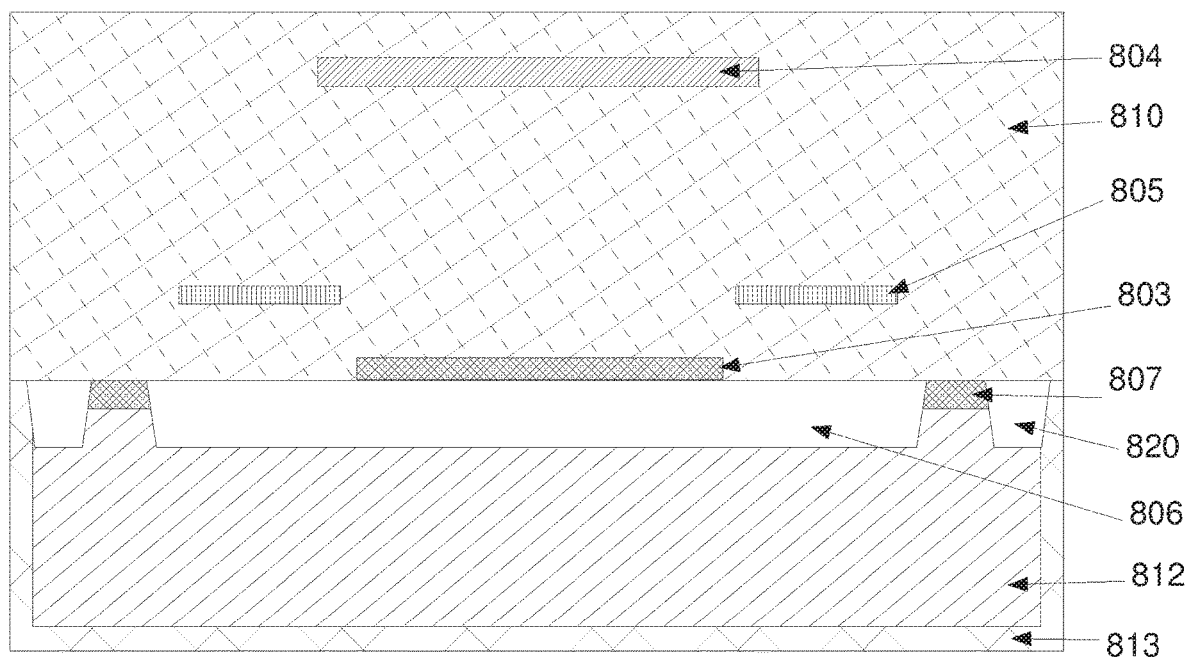
FIG. 8c shows a semiconductor device according to an embodiment of the present invention.

Alternatively, one skilled in the art would appreciate, on reading the present disclosure, that some or all of the four voltage controlled semiconductor well resistors (702, 703, 706, 707) could be replaced with polycrystalline voltage-controlled semiconductor resistors, as described herein (see e.g. FIGS. 8a-8c and associated description). Since the latter comprise an effective 'gate' connection (e.g. a voltage-control contact [VCC] in the case of a polysilicon device such as that described in US 2005/0116301 A1) and two resistor terminals, one skilled in the art would, enlightened by the present disclosure, be able to adapt the physical implementation illustrated in FIG. 7a, and described herein, to use polycrystalline voltage-controlled semiconductor resistors without exercising any inventive skill.

Returning to the description of FIG. 7a (using voltage controlled semiconductor well resistors), resistors 703 and 706 may correspond to components 303 and 302 respectively in FIGS. 3a-3e. 701 is a metal connection for supplying the positive supply of the reference voltage source/reference current source to the first and third voltage-controlled semiconductor well resistors 702, 703. 711 is a metal connection for supplying the negative/ground supply of the reference voltage/current source to the second and fourth voltage-controlled semiconductor well resistors 706, 707. 708 is a polycrystalline shield and may correspond to element 505 in FIGS. 5a-5c. 705 is a metal connection between the gates of the second and third voltage-controlled semiconductor well resistors 706, 703. The connection between the gates of the first and fourth voltage-controlled semiconductor well resistors is 712. This is the connection which is excited at the input high voltage. Consequently, certain considerations were taken into account when designing the routing of the connection 712. For example, although the connector is shown with 90 degree angles, in practice angles of 135 degrees or thereabouts have been found to reduce the electric field strength in the vicinity of the connector. This is advantageous given the high voltages which are present on the connector 712. 709 and 710 are metal connections for the negative and positive output voltages ($V_N$ and $V_P$) respectively. Elements 704 and 704' are T-shaped metal shields which will be described in more detail with reference to FIGS. 7b and 7c.

Figure 7B:
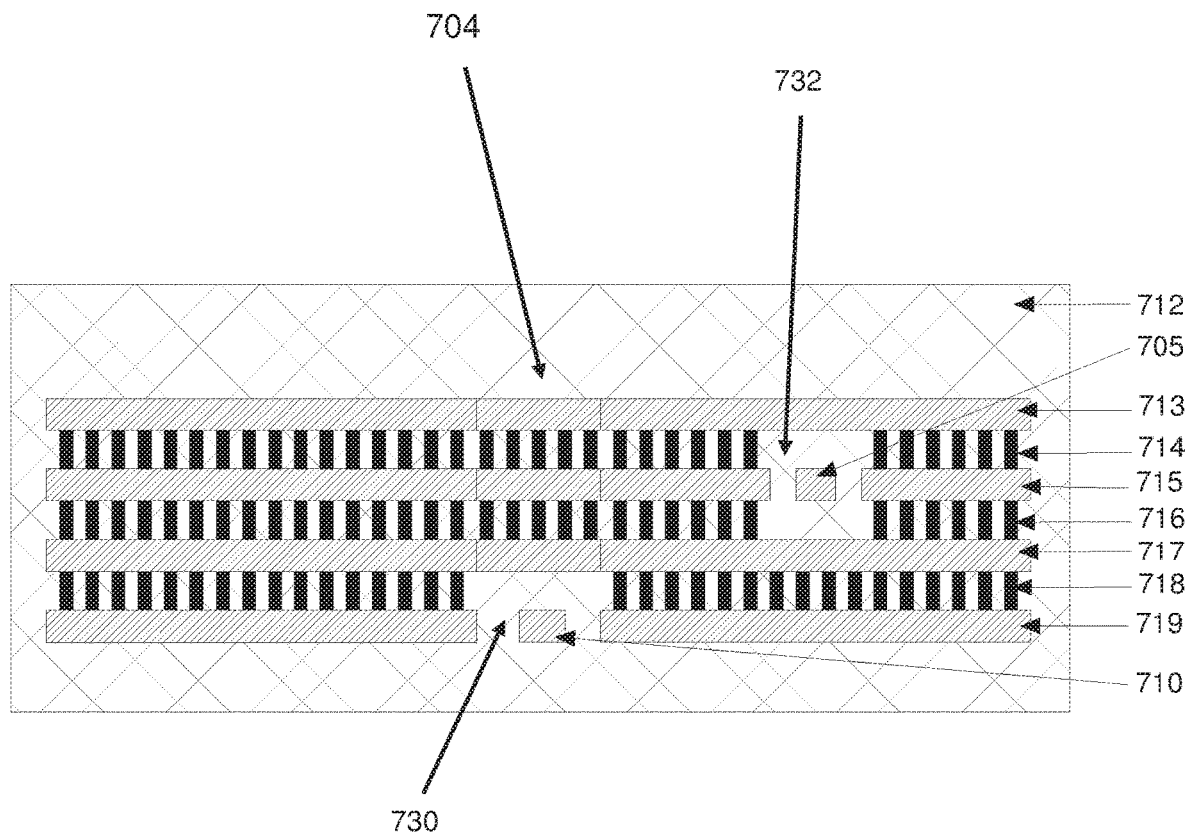
FIG. 7b shows a semiconductor device according to an embodiment of the present invention.
Figure 7C:
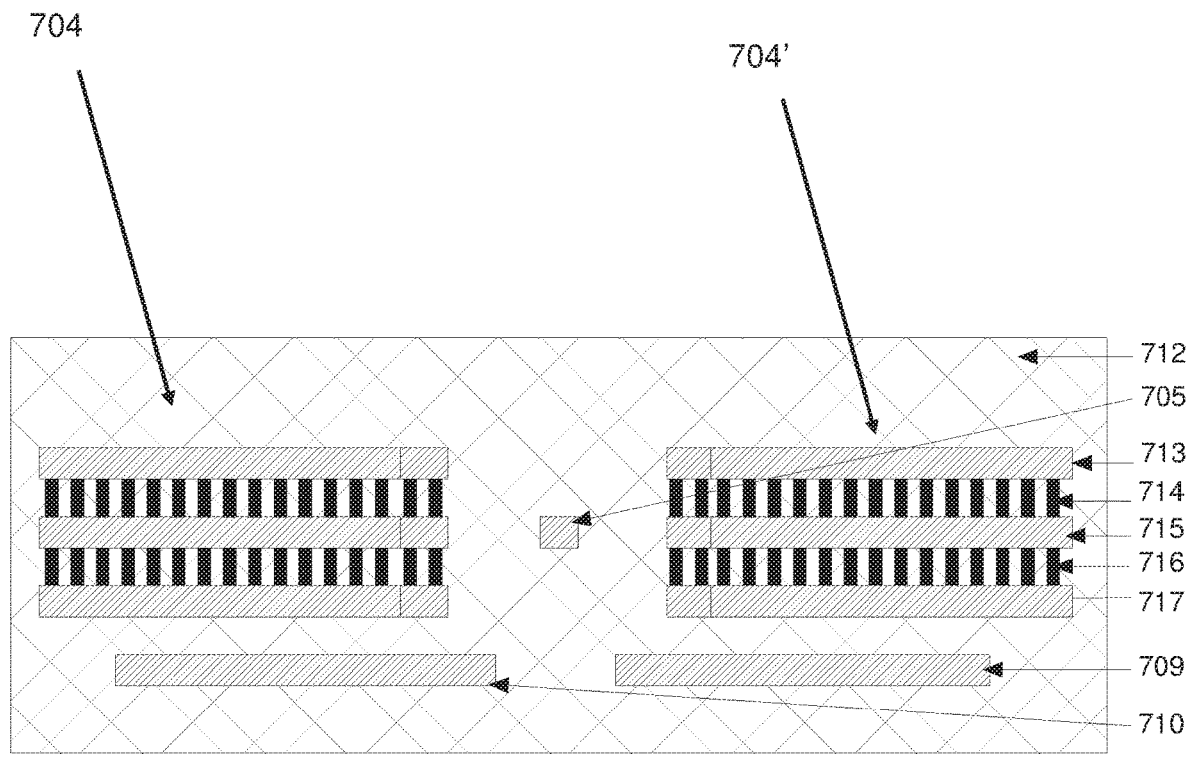
FIG. 7c shows a semiconductor device according to an embodiment of the present invention.

FIG. 7b shows the cross section through the metal shield 704 (longitudinal cut A-A of FIG. 7a). FIG. 7c shows the cross section through the metal shields 704 and 704' (transversal cut B-B in FIG. 7a). With reference to FIG. 7b, 712 is an inter-layer dielectric (ILD), e.g. silicon dioxide. Each metal shield comprises metal tracks 713, 715, 717 and 719 located within 4 distinct, vertically separated metal layers. The metal layers are located within ILD 712 and are electrically connected to each other by a plurality of vias disposed in three intervening via layers 714, 716 and 718. The metal shield comprises a number of openings 730, 732 (where there are no vias and where the metal tracks contain breaks). These openings allow other metal tracks, e.g. the metal connection 705 between the gates of the second and third voltage-controlled semiconductor well resistors and the metal connection 710 for the positive output voltage to pass through the shield approximately perpendicularly to the shield. The shield may be arranged within a semiconductor device, e.g. the sensing circuit of FIG. 7a, such that the shield helps to electrically isolate a high-voltage domain of the device from a low-voltage domain of the device. Furthermore, the openings within the shield which are used to route other metal tracks from one domain to the other domain may be specifically located at regions of the device which are known or expected to be electrically less sensitive/insensitive. By electrically less sensitive/insensitive, it is meant a region of the device where the electrical field is low when compared with other regions, either as a result of electric field cancellation or the physical separation from field-generating devices. By placing the openings at these electrically insensitive regions one can ensure, at least to a certain degree, that the shield is effectively continuous, such that the openings do not affect the isolation properties of the shield as a whole. Placing the openings in this manner also ensures, at least to a certain degree, that the low voltage tracks (which are more sensitive to pick-up from the environment, e.g. metal connection 710 for the positive output voltage) are routed in areas of the device where they can be expected to be exposed to a lower electric field as compared to being routed in other areas of the device—owing to the openings being placed at the electrically insensitive regions. An electrically insensitive region may arise due to the symmetry of the distribution of components and voltages within the device.

The shields 704 and 704' may further comprise a polyimide re-passivation layer, such as that which is also used in conjunction with the voltage-controlled semiconductor well resistor described above. The lateral spacing between vias in the shield is of the same order of magnitude as the vertical separation between adjacent metal tracks of the shield. Specifically, the lateral via spacing may be 50%-200% of the spacing between adjacent metal tracks of the shield. FIG. 7c shows how the number of metal tracks/via layers in the shield may vary depending on the presence of additional tracks running parallel to and in places directly under and parallel to the shield, in this case the metal connections for the negative and positive output voltages ($V_N$ and $V_P$) 709 and 710 respectively. The metal shields 704 and 704' are connected to a low impedance reference signal (e.g. ground) to terminate any disturbing electric field, thereby preventing it from being picked up by the surrounding/nearby components/tracks. This allows substantially undisturbed signal routing of the sensitive output signal tracks across/through/under the shield. Furthermore, the shield has only limited openings at the sense positions of the measurement bridge. Viewed from above, the device layout is such that the four voltage-controlled semiconductor well resistors are in a 2×2 grid configuration with the two high-voltage input voltage-controlled semiconductor well resistors diametrically opposed on one diagonal and the two low-voltage input voltage-controlled semiconductor well resistors diametrically opposed on the opposite diagonal. The first and second voltage-controlled semiconductor well resistors 702, 706 are separated from the third and fourth voltage-controlled semiconductor well resistors 703, 707 by two metals shields 704 and 704'. Further, the first voltage-controlled semiconductor well resistor 702 is separated from the second voltage-controlled semiconductor well resistor 706 by one metal shield (a portion of shield 704), and the third voltage-controlled semiconductor well resistor 703 is also separated from the fourth voltage-controlled semiconductor well resistor 707 by one metal shield (a portion of shield 704').

FIGS. 8a-8c illustrate a voltage-controlled polycrystalline resistor 800 according to an embodiment of the present invention, whereby FIG. 8a shows a top-down view, FIG. 8b shows a cross section cut through the line A-A in FIG. 8a, and FIG. 8c shows a cross section cut through the line B-B in FIG. 8a. The device 800 is structured as follows. The basis of the device is a p-type semiconductor wafer 813 in which is formed an n-type well 812 which extends into the substrate in a localized region of approximately rectangular profile when the device is viewed from above. The n-type well protects/isolates the p-type wafer (alternatively, the device could be based on an n-type semiconductor wafer in which is formed a p-type well). The device has mirror symmetry in two orthogonal planes which are perpendicular to the substrate and intersect each other at the centre of the n-type well. A first shallow-trench isolation (STI) region 806 is formed on top of the n-type well. When viewed in the first cross section (FIG. 8b), the regions of the n-type well 812 which are not covered by the first STI region 806 are covered on either side by n+ diffusion regions 807, for connecting to the n-type well 812. Also, when viewed in the first cross section, positioned laterally outwards from the two n+ diffusion regions 807 is a second STI region 820. In the second cross section (FIG. 8c), laterally outward of the first STI region 806 are the n+ diffusion regions 807 and then still further laterally outward are the second STI regions 820.

A first polycrystalline semiconductor layer 803 is situated on top of the first STI region 806. This first polycrystalline semiconductor layer forms the resistive element of the voltage-controlled polycrystalline semiconductor resistor. Viewed in the first cross section the first polycrystalline layer 803 extends over more than half of the first STI region 806 but not over the full length of the first STI region. Extending vertically out of two opposing sides of the first polycrystalline semiconductor layer 803 are metal contacts 801, 809 leading to metal tracks 811. These are used for connecting other parts of an integrated circuit or external circuit to the voltage-controlled polycrystalline resistor. The region above the substrate is filled with an inter-layer dielectric (ILD) medium 810. Viewed in the first cross section, a metal gate electrode 804 is formed in the ILD and positioned centrally above the first polycrystalline semiconductor layer 803. The gate electrode 804 enables the resistance of the first polycrystalline semiconductor layer 803 to be controlled by means of an applied voltage. This is the manner in which the resistance of the voltage-controlled polycrystalline resistor is varied.

A second polycrystalline layer 805 is situated in the ILD at a location vertically between the first polycrystalline layer 803 and the gate electrode 804. Seen in the second cross section (FIG. 8c) the second polycrystalline layer 805 surrounds a region between the gate electrode and the first polycrystalline layer. Seen from above, the second polycrystalline layer 805 comprises two strips running parallel to and either side of the first polycrystalline layer 803 serving as the resistor element, although other geometries are contemplated. The second polycrystalline layer may function as a shield, in a similar manner to that described above with reference to the n- and p-type well resistors (see e.g. FIGS. 5a-5e). For example, it might be useful to protect other circuits on the same chip from the electrostatic field generated by the gate electrode (to prevent parametric drifts, for example). However, its purpose is not restricted to a shield and this use is mentioned only as one example of a potential use of such a second polycrystalline semiconductor layer as employed in a voltage-controlled polycrystalline semiconductor resistor. Furthermore, the second polycrystalline layer may be disposed at a different position with respect to the gate and the first polycrystalline semiconductor layer than that described above. For example, it may be positioned closer to the substrate than both the first polycrystalline layer and the gate electrode, or alternatively it may be positioned further from the substrate than both the first polycrystalline layer and the gate electrode. Although described above as a polycrystalline layer, the layer 805 could alternatively be formed of some other conductive material such as metal. For example, if deployed as a shield, the shielding properties may be satisfactorily achieved with a metal layer rather than a polycrystalline semiconductor layer. The inventors have also appreciated that such a second polycrystalline/metal layer 805 may also be deployed in conjunction with voltage-controlled polycrystalline semiconductor devices operating on a different principle than that described herein, e.g. in conjunction with a Schottky diode-based resistor, such as that described in US 2005/0116301 A1, for example.

A number of applications of various aspects of the present invention will now be described.

Arc Fault Circuit Interrupters (AFCI)—for arc fault circuit interrupters, the purpose is to disconnect electrical devices from the power grid whenever strange transients occur in a combination of the phase voltage and the current. Measuring the voltage is currently achieved by having voltage nodes measured by integrated circuits (ICs) that are galvanically isolated from the secondary side using opto-couplers. Achieving the isolation in the IC itself, which is possible according to embodiments of the present invention, may enable the miniaturization of the device and also a reduction of cost/complexity.

Maximum Power Point Tracking (MPPT)—for photovoltaic applications (PV), the return on investment is directly proportional to the efficiency at which the system is operating. Tracking the maximum power point enables exactly that: making sure that the efficiency is good, and this is achieved by measuring the current and the voltage. Being able to measure the voltage in an isolated way provides additional cost efficiencies that are otherwise not achievable with opto-couplers and separate measurement ICs.

Localized power measurement for commercial lighting—this would involve measurement of at least current but potentially also voltage in case the distinction needs to be made between active & reactive power for lighting as well. An example application circuit for power measurement is shown in FIGS. 4a and 4b, described above.

Class X or 0.X power meters—power meters are supposed to sense active and reactive power, which also requires galvanically isolated voltage measurement. The same applies as for AFCI: that is to say isolated voltage measurement with no resistive division to provide galvanic isolation.

DC/DC converters (automotive and other)—electric vehicles (EVs) and hybrid electric vehicles (HEVs) often require DC/DC converters and the present invention could provide for same in an integrated manner. The same applies to isolation from a high-voltage output of a lithium-ion battery to a secondary (lower voltage) output.

Electric field sensors—an external electric field can be measured using the Wheatstone bridge configuration of the present invention. Since the measurement can be done substantially without any current drain from the source, electrostatic fields can be detected and measured without incorporating mechanical elements, as is the case for field mills (specialized instruments used for measuring the strength of electrical fields in the atmosphere near thunderstorm clouds).

Although FIGS. 7a-7c illustrate the physical structure of part of a device corresponding to one of the circuits shown in FIGS. 3a-3f, the inventors have appreciated that modifications to the layout of the structure shown in FIGS. 7a-7c could be made to apply the same concepts (e.g. shielded routing channel, voltage-controlled semiconductor well resistors) in implementing also the circuits of FIGS. 3g and 3h. Furthermore, various aspects of the present invention are provided independently and their application is not limited to the specific circuits disclosed herein. For example, the inventors have appreciated that the shielded routing channel shown in FIGS. 7b and 7c can be applied to other circuits not based on a Wheatstone bridge and/or not including voltage-controlled semiconductor well resistors.

Although the invention has been described in terms of certain embodiments as set forth above, it should be understood that these embodiments are illustrative only and that the claims are not limited to those embodiments. Those skilled in the art will be able to make modifications and alternatives in view of the disclosure which are contemplated as falling within the scope of the appended claims. Each feature disclosed or illustrated in the present specification may be incorporated in the invention, whether alone or in any appropriate combination with any other feature disclosed or illustrated herein.

Aspects of the invention may also be defined by means of the following numbered clauses:

1. A Wheatstone bridge comprising a number of resistors, wherein at least one of the resistors of the Wheatstone bridge is a voltage-controlled semiconductor resistor.

2. The Wheatstone bridge according to clause 1, comprising four voltage-controlled semiconductor resistors.

3. The Wheatstone bridge according to clause 1 or 2, wherein at least one of the one or more voltage-controlled semiconductor resistors is a voltage-controlled semiconductor well resistor.

4. The Wheatstone bridge according to clause 1 or 2, wherein at least one of the one or more voltage-controlled semiconductor resistors is a polycrystalline voltage-controlled semiconductor resistor.

5. A method of determining a measure indicative of a voltage, the method utilizing a circuit comprising a Wheatstone bridge, the Wheatstone bridge comprising a number of resistors, wherein at least one of the resistors of the Wheatstone bridge is a voltage-controlled semiconductor resistor.

6. The method according to clause 5, wherein at least one of the at least one voltage-controlled semiconductor resistor is a voltage-controlled semiconductor well resistor.

7. The method according to clause 5, wherein at least one of the at least one voltage-controlled semiconductor resistor is a polycrystalline voltage-controlled semiconductor resistor.

8. The method according to any one of clauses 5-7, wherein determining the measure indicative of the voltage comprises generating an output voltage of the circuit.

9. The method according to clause 8, wherein the magnitude of the output voltage of the circuit used for determining said voltage is less than 10V.

10. The method according to clause 8 or 9, wherein the output voltage is derived from a differential measurement.

11. The method according to any one of clauses 5-7, wherein determining the measure indicative of the voltage comprises generating an output current of the circuit.

12. The method according to clause 11, wherein the output current is derived from a differential measurement.

13. The method according to any one of clauses 5-12, wherein the circuit can withstand said voltage having any magnitude in the range 0-2500V.

14. The method according to any one of clauses 5-13, wherein the circuit draws substantially no power from a source providing said voltage.

15. A method of determining a measure indicative of a voltage, the method comprising applying the voltage to one or more components of a Wheatstone bridge circuit, wherein the Wheatstone bridge circuit comprises a reference source.

16. The method according to clause 15, wherein the reference source is connected directly to the Wheatstone bridge circuit.

17. The method according to clause 16 wherein the Wheatstone bridge circuit comprises a number of resistors and the reference source is a reference voltage source connected thereacross.

18. The method according to clause 16, wherein the Wheatstone bridge circuit comprises a number of resistors and the reference source is a reference current source connected thereto.

19. The method according to any one of clauses 15-18, wherein determining the measure indicative of the voltage comprises generating an output voltage of the circuit.

20. The method according to clause 19, wherein the magnitude of the output voltage of the circuit used for determining said voltage is less than 10V.

21. The method according to clause 19 or 20, wherein the output voltage is derived from a differential measurement.

22. The method according to any one of clauses 15-18, wherein determining the measure indicative of the voltage comprises generating an output current of the circuit.

23. The method according to clause 22, wherein the output current is derived from a differential measurement.

24. The method according to any one of clauses 15-23, wherein the circuit can withstand said voltage having any magnitude in the range 0-2500V.

25. The method according to any one of clauses 15-24, wherein the circuit draws substantially no power from a source providing said voltage.

26. A circuit for sensing an input voltage, the circuit providing an output, the circuit comprising:
  a first series combination of first and second voltage-controlled semiconductor resistors, the first series combination being connected in parallel with a second series combination of third and fourth voltage-controlled semiconductor resistors, wherein each voltage-controlled semiconductor resistor includes a gate, and wherein the first voltage-controlled semiconductor resistor is connected directly to the third voltage-controlled semiconductor resistor; and
  a reference source; wherein:
  the reference source is connected to the first series combination and also to the second series combination;
  the gates of the first and fourth voltage-controlled semiconductor resistors are held equipotential by means of a first electrical interconnector, and the gates of the second and third voltage-controlled semiconductor resistors are held equipotential by means of a second electrical interconnector;
  the first and second electrical interconnectors are provided with respective connectors for applying the input voltage therebetween; and
  the output is arranged to be derived from either:
  a) a potential difference between:
    i) a first point between the first and second voltage-controlled semiconductor resistors, and
    ii) a second point between the third and fourth voltage-controlled semiconductor resistors; or
  b) a current flowing between:
    i) a first point between the first and second voltage-controlled semiconductor resistors, and
    ii) a second point between the third and fourth voltage-controlled semiconductor resistors.

27. A circuit for sensing an input voltage, the circuit providing an output, the circuit comprising:
  a first series combination of first and second voltage-controlled semiconductor resistors, the first series combination being connected in parallel with a second series combination of third and fourth voltage-controlled semiconductor resistors, wherein each voltage-controlled semiconductor resistor includes a gate, and wherein the first voltage-controlled semiconductor resistor is connected directly to the third voltage-controlled semiconductor resistor; and
  a reference source; wherein:
  the reference source is connected to the first series combination and also to the second series combination;
  the gates of the second, third and fourth voltage-controlled semiconductor resistors are held equipotential by means of an electrical interconnector;
  the gate of the first voltage-controlled resistor and said electrical interconnector are provided with respective connectors for applying the input voltage therebetween; and
  the output is arranged to be derived from either:
  a) a potential difference between:
    i) a first point between the first and second voltage-controlled semiconductor resistors, and
    ii) a second point between the third and fourth voltage-controlled semiconductor resistors; or
  b) a current flowing between:
    i) a first point between the first and second voltage-controlled semiconductor resistors, and
    ii) a second point between the third and fourth voltage-controlled semiconductor resistors.

28. A circuit for sensing an input voltage, the circuit providing an output, the circuit comprising:
  a first series combination of first and second resistors, the first series combination being connected in parallel with a second series combination of third and fourth resistors, wherein the first resistor is connected directly to the third resistor; and
  a reference source; wherein:
  the reference source is connected to the first series combination and also to the second series combination;
  the first resistor is a voltage-controlled semiconductor resistor including a gate;
  the second and fourth resistors are connected by means of an electrical interconnector;
  the gate of the first voltage-controlled resistor and said electrical interconnector are provided with respective connectors for applying the input voltage therebetween; and
  the output is arranged to be derived from either:
  a) a potential difference between:
    i) a first point between the first and second resistors, and
    ii) a second point between the third and fourth resistors; or b) a current flowing between:
   i) a first point between the first and second resistors, and
   ii) a second point between the third and fourth resistors.

29. The circuit according to any one of clauses 26-28, wherein the reference source is a reference voltage source.

30. The circuit according to any one of clauses 26-28, wherein the reference source is a reference current source.

31. The circuit according to any one of clauses 26-30, wherein the circuit can withstand said input voltage having any magnitude in the range 0-2500V.

32. The circuit according to any one of clauses 26-31, further comprising a differential amplifier, wherein one of the inputs of the differential amplifier is connected to said first point and the other one of the inputs of the differential amplifier is connected to said second point, the output of the differential amplifier providing said output.

33. The circuit according to any one of clauses 26 to 32, wherein at least one of the at least one voltage-controlled semiconductor resistors is a voltage-controlled semiconductor well resistor.

34. The circuit according to any one of clauses 26 to 32, wherein at least one of the at least one voltage-controlled semiconductor resistors is a polycrystalline voltage-controlled semiconductor resistor.

35. A semiconductor device comprising a first polycrystalline semiconductor layer forming a shield.

36. The semiconductor device according to clause 35, wherein said device is a voltage-controlled semiconductor well resistor comprising a gate and a well, and wherein the first polycrystalline semiconductor layer surrounds a region between the gate and the well.

37. The semiconductor device according to clause 36, wherein the footprint of the gate falls within the footprint of the shield in at least one cross-section taken through the device.

38. The semiconductor device according to clause 37, wherein the footprint is defined as the projection as viewed along a direction perpendicular to a main surface of the gate.

39. The semiconductor device according to any one of clauses 36 to 38, further comprising a shallow-trench isolation region between the well and the gate, or between the partially-conductive element and the gate, wherein the shield is disposed over part of the shallow-trench isolation region.

40. The semiconductor device according to any one of clauses 36 to 39, further comprising an inter-layer dielectric material disposed in a region between the well and the gate, or between the partially-conductive element and the gate.

41. The semiconductor device according to clause 40, wherein a thickness of the inter-layer dielectric material is such that the device can withstand a voltage with a magnitude of up to 2500 V applied at the gate thereof.

42. The semiconductor device according to any one of clauses 35 to 41, further comprising a re-passivation layer formed of polyimide.

43. The semiconductor device according to any one of clauses 35 to 42, further comprising a connector for connecting the shield to a low-impedance reference source.

44. A method for use in manufacturing a voltage-controlled semiconductor well resistor, the method comprising:
   providing a semiconductor substrate;
   forming a well region within the substrate;
   forming a polycrystalline semiconductor layer on or above the substrate;
   forming a dielectric layer on or above the substrate; and
   forming a gate within a conductive layer above said polycrystalline semiconductor layer, wherein the polycrystalline semiconductor layer forms a shield surrounding a region between the gate and the well.

45. The method according to clause 44, further comprising selecting, based on a model, the thickness of the dielectric layer such that according to said model the voltage-controlled semiconductor well resistor can withstand a desired maximum voltage applied at the gate thereof.

46. The method according to clause 45, wherein said desired maximum voltage is 2500 V.

47. A shield for a semiconductor device comprising a plurality of substantially parallel conductive tracks mutually electrically connected by a plurality of vias, and a connector for connecting the shield to a low-impedance reference source.

48. The shield according to clause 47, further comprising one or more openings for routing additional tracks through the shield.

49. The shield according to clause 48, wherein said additional tracks are arranged to be routed substantially perpendicular to the parallel conductive tracks of the shield.

50. The shield according to any one of clauses 47 to 49, wherein the vias are arranged perpendicular to the parallel conductive tracks, and wherein the vias are substantially evenly laterally distributed between adjacent parallel conductive tracks.

51. The shield according to clause 50, wherein the lateral spacing between the vias is 50-200% of the spacing between the parallel conductive tracks.

52. The shield according to clause 48, wherein the one or more openings extend between two or three parallel conductive tracks in the direction perpendicular to the parallel conductive tracks.

53. The shield according to clause 52, wherein the one or more openings are substantially square in cross section.

54. The shield according to any one of clauses 47 to 53, further comprising a re-passivation layer formed of polyimide.

55. A semiconductor device comprising a high-voltage domain and a low-voltage domain, the semiconductor device further comprising a shield according to any one of clauses 47 to 54, the shield arranged so as to substantially electrically isolate the high-voltage domain from the low-voltage domain.

56. The semiconductor device according to clause 55 when directly or indirectly dependent on clause 48, wherein the one or more openings are positioned at electrically insensitive regions of the device.

57. A method of manufacturing a shield for a semiconductor device, the method comprising:
   forming a first track in a first conductive layer;
   forming a second track in a second conductive layer, the second track being substantially parallel to and above the first track;
   forming a plurality of vias between the first and second tracks;
   forming a connector for connecting the shield to a low-impedance reference source.

58. A sensing device for sensing a high voltage, the sensing device comprising a circuit according to any one of clauses 26 to 34, wherein the or each voltage-controlled semiconductor resistor is as according to any one of clauses 36 to 43 or 65 to 67 and one or more interconnectors are routed through, or parallel to, one or more shields according to any one of clauses 47 to 54.

59. The sensing device according to clause 58, wherein:
four such voltage-controlled semiconductor resistors are provided, the four voltage-controlled semiconductor resistors being arranged substantially coplanar in a 2×2 grid configuration;
the first and fourth voltage-controlled semiconductor resistors are diagonally opposed;
the second and third voltage-controlled semiconductor resistors are diagonally opposed; and
at least one of the voltage-controlled semiconductor resistors is separated from another of the voltage-controlled semiconductor resistors by at least one said shield.

60. The sensing device according to clause 59, wherein the first and second voltage-controlled semiconductor resistors are separated from the third and fourth voltage-controlled semiconductor resistors by at least one said shield.

61. The sensing device according to clause 59 or 60, wherein the first voltage-controlled semiconductor resistor is separated from the second voltage-controlled semiconductor resistor by at least one said shield.

62. The sensing device according to any one of clauses 59 to 61, wherein the third voltage-controlled semiconductor resistor is separated from the fourth voltage-controlled semiconductor resistor by at least one said shield.

63. A power meter comprising the sensing device according to any one of clauses 58 to 62 and a current sensor.

64. The power meter according to clause 63, wherein the current sensor is a Hall-effect current sensor.

65. A voltage-controlled polycrystalline semiconductor resistor comprising: a gate formed in a first metal layer, a resistive element formed in a first polycrystalline semiconductor layer; and a further element formed in either a second polycrystalline layer or in a second metal layer.

66. The voltage-controlled polycrystalline semiconductor resistor according to clause 65, wherein the further element is configured to serve as a termination for an electric field originating from the gate.

67. The voltage-controlled polycrystalline semiconductor resistor according to clause 65 or 66, wherein the second element surrounds a region between the gate and the resistive element.

68. A method for use in manufacturing a voltage-controlled polycrystalline semiconductor resistor, the method comprising:
providing a semiconductor substrate;
forming a resistive element in a first polycrystalline semiconductor layer on or above the substrate;
forming a gate within a conductive layer above said first polycrystalline semiconductor layer;
forming a further element in either a second polycrystalline layer or a second metal layer; and
forming a dielectric layer on or above the substrate.

The invention claimed is:

1. A voltage-controlled semiconductor well resistor comprising a gate, a well and a first polycrystalline semiconductor layer forming a shield, wherein the first polycrystalline semiconductor layer has an opening and forms a ring that surrounds a region between the gate and the well, wherein the gate is arranged to control the conductivity in a resistor region of said well resistor.

2. The voltage-controlled semiconductor well resistor according to claim 1, wherein the footprint of the gate falls within the footprint of the shield in at least one cross-section taken through the device.

3. The voltage-controlled semiconductor well resistor according to claim 2, wherein the footprint is defined as the projection as viewed along a direction perpendicular to a main surface of the gate.

4. The voltage-controlled semiconductor well resistor of claim 1, wherein a resistance of said well resistor depends linearly on a voltage applied to said gate.

5. The voltage-controlled semiconductor well resistor according to claim 1, wherein said well resistor can withstand up to 2500 V at said gate and has a monotonic change in resistance over the complete input gate voltage range (0 V to 2500 V).

6. The voltage-controlled semiconductor well resistor of claim 1, wherein said well is a first well having a first type of doping and is surrounded laterally on all sides by a second well having a second, different type of doping, and wherein said first and second wells extend a substantially same depth into a semiconductor substrate.

7. The voltage-controlled semiconductor well resistor of claim 1, wherein said region surrounded by said first polycrystalline semiconductor layer comprises an inter-layer dielectric.

8. The voltage-controlled semiconductor well resistor of claim 1, wherein said opening is a substantially rectangular cut-out.

9. The voltage-controlled semiconductor well resistor of claim 1, wherein said first polycrystalline semiconductor layer overlaps an outer part of said well, while said opening exposes an inner part of said well, such that an electric field emanating from said gate penetrates said inner part of said well but not said outer part.

10. The voltage-controlled semiconductor well resistor of claim 1, wherein said gate overlaps a part of said first polycrystalline semiconductor layer.

11. The voltage-controlled semiconductor well resistor of claim 10, wherein said part of said first polycrystalline semiconductor layer overlaps a part of said well.

12. The voltage-controlled semiconductor well resistor of claim 1, wherein said shield is arranged relative to said well to substantially prevent parasitic field inversion due to an electric field emanating from said gate.

13. The voltage-controlled semiconductor well resistor of claim 1, wherein said first polycrystalline semiconductor layer is connected directly to ground.

14. The voltage-controlled semiconductor well resistor of claim 1, wherein said first polycrystalline semiconductor layer is separated from said gate by an inter-layer dielectric.

15. A method for use in manufacturing a voltage-controlled semiconductor well resistor, the method comprising:
providing a semiconductor substrate;
forming a well region within the substrate;
forming a polycrystalline semiconductor layer on or above the substrate;
forming a dielectric layer on or above the substrate; and
forming a gate within a conductive layer above said polycrystalline semiconductor layer,
wherein the polycrystalline semiconductor layer forms a shield having an opening and forms a ring surrounding a region between the gate and the well, and
wherein the gate is arranged to control the conductivity in a resistor region of said well resistor.

* * * * *

UNITED STATES PATENT AND TRADEMARK OFFICE
CERTIFICATE OF CORRECTION

PATENT NO. : 11,009,529 B2  
APPLICATION NO. : 15/715268  
DATED : May 18, 2021  
INVENTOR(S) : Klaus Heinrich et al.

Page 1 of 1

It is certified that error appears in the above-identified patent and that said Letters Patent is hereby corrected as shown below:

On the Title Page

Item (73) Please DELETE the following:
"(73) Assignee: X-FAB SEMICONDUCTOR FOUNDRIES GMBH, Erfurt (DE)"

And REPLACE with:
(73) Assignee: X-FAB SEMICONDUCTOR FOUNDRIES GMBH, Erfurt (DE)
         MELEXIS TECHNOLOGIES SA, Bevaix (CH)

Signed and Sealed this  
First Day of June, 2021

Drew Hirshfeld  
*Performing the Functions and Duties of the*  
*Under Secretary of Commerce for Intellectual Property and*  
*Director of the United States Patent and Trademark Office*